US 9,552,885 B2

(12) United States Patent
Shukla et al.

(10) Patent No.: US 9,552,885 B2
(45) Date of Patent: Jan. 24, 2017

(54) PARTIAL BLOCK ERASE FOR OPEN BLOCK READING IN NON-VOLATILE MEMORY

(71) Applicant: SanDisk Technologies Inc., Plano, TX (US)

(72) Inventors: Pitamber Shukla, Milpitas, CA (US); Henry Chin, Fremont, CA (US); Dana Lee, Saratoga, CA (US); Cynthia Hsu, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/794,242

(22) Filed: Jul. 8, 2015

(65) Prior Publication Data

US 2016/0172045 A1 Jun. 16, 2016

Related U.S. Application Data

(60) Provisional application No. 62/089,838, filed on Dec. 10, 2014.

(51) Int. Cl.
| G11C 16/04 | (2006.01) |
| G11C 16/16 | (2006.01) |
| G11C 11/56 | (2006.01) |
| G11C 16/34 | (2006.01) |
| G11C 16/26 | (2006.01) |

(52) U.S. Cl.
CPC ........... G11C 16/16 (2013.01); G11C 11/5628 (2013.01); G11C 16/0483 (2013.01); G11C 16/26 (2013.01); G11C 16/3431 (2013.01); G11C 16/3445 (2013.01); G11C 2211/5644 (2013.01)

(58) Field of Classification Search
CPC ............................ G11C 16/0483; G11C 16/10
USPC ........................................ 365/185.12, 185.18
See application file for complete search history.

(56) References Cited

U.S. PATENT DOCUMENTS

| 6,426,898 | B1 | 7/2002 | Mihnea |
| 6,707,714 | B2 | 3/2004 | Kawamura |
| 7,403,424 | B2 | 7/2008 | Hemink et al. |
| 7,430,138 | B2 | 9/2008 | Higashitani |
| 7,457,166 | B2 | 11/2008 | Hemink et al. |
| 7,495,954 | B2 | 2/2009 | Ito |
| 7,804,718 | B2 | 9/2010 | Kim |
| 7,808,831 | B2 | 10/2010 | Mokhlesi et al. |
| 7,818,525 | B1 | 10/2010 | Frost et al. |
| 7,839,690 | B2 | 11/2010 | Lee et al. |
| 7,907,449 | B2 | 3/2011 | Lee et al. |

(Continued)

OTHER PUBLICATIONS

U.S. Appl. No. 14/794,236, filed Jul. 8, 2015.

(Continued)

Primary Examiner — Huan Hoang
(74) Attorney, Agent, or Firm — Vierra Magen Marcus LLP

(57) ABSTRACT

A non-volatile memory system mitigates the effects of open block reading by analyzing the un-programmed region of a block before programming to determine a potential for read disturbance. The system may determine a read count value associated with open block reading of the memory block and/or perform partial block erase verification. To mitigate the effects of open block read disturbance, the system performs partial block erase for the un-programmed region of the memory block and/or limits programming in the un-programmed region.

27 Claims, 20 Drawing Sheets

(56) References Cited

U.S. PATENT DOCUMENTS

| | | | |
|---|---|---|---|
| 7,965,554 B2 | 6/2011 | Lutze et al. | |
| 8,014,209 B2 | 9/2011 | Lutze et al. | |
| 8,144,511 B2 | 3/2012 | Dong et al. | |
| 8,248,848 B1 | 8/2012 | Tang | |
| 8,422,303 B2 | 4/2013 | Franca-Neto et al. | |
| 8,488,382 B1 | 7/2013 | Li et al. | |
| 8,649,215 B2 | 2/2014 | Franca-Neto et al. | |
| 8,670,285 B2 | 3/2014 | Dong et al. | |
| 8,743,615 B2 | 6/2014 | Lee et al. | |
| 8,787,094 B2 | 7/2014 | Costa et al. | |
| 8,824,211 B1 | 9/2014 | Costa et al. | |
| 8,885,420 B2 | 11/2014 | Oowada et al. | |
| 8,897,070 B2 | 11/2014 | Dong et al. | |
| 2012/0008405 A1* | 1/2012 | Shah ................. | G11C 29/02 365/185.19 |
| 2013/0007353 A1 | 1/2013 | Shim et al. | |
| 2013/0070530 A1 | 3/2013 | Chen et al. | |
| 2013/0314995 A1 | 11/2013 | Dutta et al. | |
| 2014/0043916 A1 | 2/2014 | Costa et al. | |
| 2015/0071008 A1 | 3/2015 | Yang et al. | |

OTHER PUBLICATIONS

International Search Report & the Written Opinion of the International Searching Authority dated Feb. 10, 2016, International Application No. PCT/US2015/054460.
U.S. Appl. No. 14/619,857, filed Feb. 11, 2015.
U.S. Appl. No. 14/518,340, filed Oct. 20, 2014.
U.S. Appl. No. 62/088,020, filed Dec. 5, 2014.

\* cited by examiner

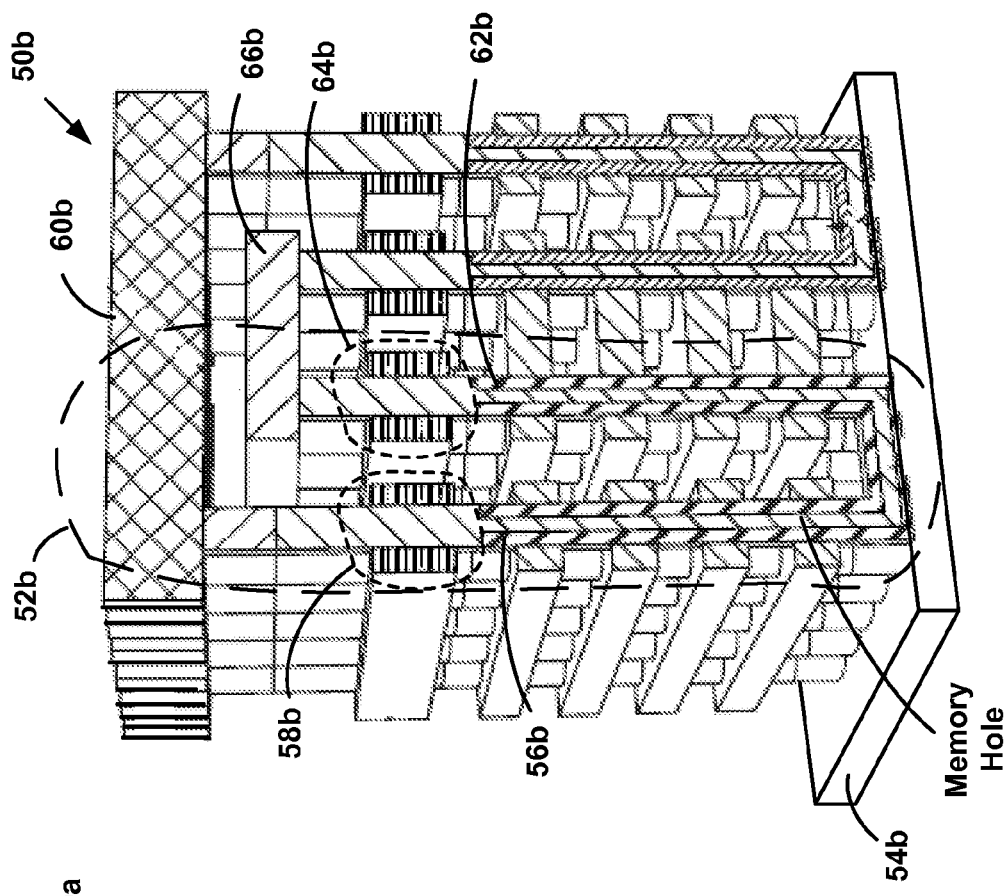
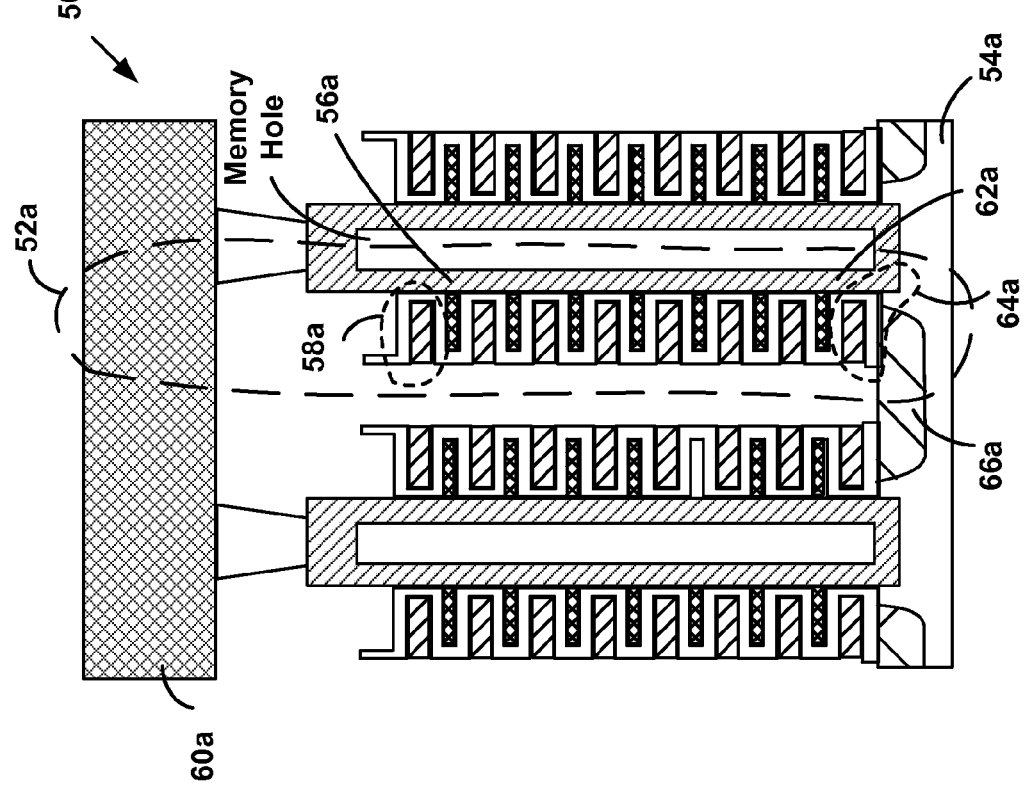
FIG. 5B
FIG. 5A

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

PROGRAM TO WLn FINE STAGE (WLn+1 FOGGY PHASE, WLn+2 IM PHASE)

READ WL2 m TIMES (RD1)

PROGRAM WLn+1 to WL127 and READ WL2 (RD2)

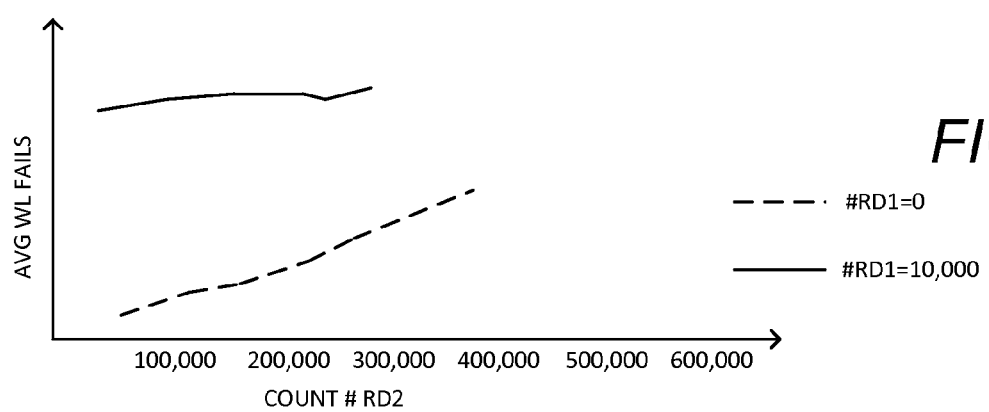

|  | WL Status | Erase Verify Option 1 | Erase Verify Option 2 |
|---|---|---|---|
| Bit Line |  | 0V | 0V |
| SGD |  | VSG | VSG |
| WL127 | ERASE | Vev | Vev |
| WL126 | ERASE | Vev | Vev |
| . . . | ERASE | Vev | Vev |
| WLn+3 | ERASE | Vev | Vint |
| WLn+2 | IM | Vint | Vint |
| WLn+1 | FOGGY | Vread | Vread |
| WLn | FINE | Vread | Vread |
| . . . | FINE | Vread | Vread |
| WL1 | FINE | Vread | Vread |
| WL0 | FINE | Vread | Vread |
| SGS |  | VSG | VSG |
| Source Line |  | VDD | VDD |
| P-Well |  | 0V | 0V |

FIG. 20

| WL | WL Status | Erase Option 1 | Erase Option 2 |
|---|---|---|---|
| Bit Line | | Floating | Floating |
| SGD | | Floating | Floating |
| WL127 | ERASE | 0V | 0V |
| WL126 | ERASE | 0V | 0V |
| . . . | ERASE | 0V | 0V |
| WLn+3 | ERASE | 0V | Vint |
| WLn+2 | IM | Vint | Vint |
| WLn+1 | FOGGY | Vinh | Vinh |
| WLn | FINE | Vinh | Vinh |
| . . . | FINE | Vinh | Vinh |
| WL1 | FINE | Vinh | Vinh |
| WL0 | FINE | Vinh | Vinh |
| SGS | | Floating | Floating |
| Source Line | | Floating | Floating |
| P-Well | | Verase | Verase |

PARTIAL BLOCK ERASE FOR OPEN BLOCK READING IN NON-VOLATILE MEMORY

PRIORITY CLAIM

The present application claims priority from U.S. Provisional Patent Application No. 62/089,838, entitled "Partial Erase to Improve the Open Block RD," by Shukla et al., filed Dec. 10, 2014, incorporated by reference herein in its entirety.

BACKGROUND OF THE INVENTION

The present disclosure is directed to non-volatile memory technology.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (VTH) of the transistor thus formed is controlled by the amount of charge that is retained on the floating gate. That is, the minimum amount of voltage that must be applied to the control gate before the transistor is turned on to permit conduction between its source and drain is controlled by the amount of charge in the floating gate. Another type of memory cell useful in flash EEPROM systems utilizes a non-conductive dielectric material in place of a conductive floating gate to store charge in a non-volatile manner.

Some EEPROM and flash memory devices have a floating gate that is used to store two ranges of charges and, therefore, depending on the number of charges inside the floating gate the memory element can either be in an erased state or in a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage VPGM is applied to the control gate during a program operation as a series of pulses that increase in magnitude over time. In one possible approach, the magnitude of the pulses is increased with each successive pulse by a predetermined step size, e.g., 0.2-0.4V. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically VPGM is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state.

Once a non-volatile storage element has been programmed, it is important that its programming state can be read back with a high degree of reliability. However, the sensed programming state can sometimes vary from the intended programming state due to factors including noise and the tendency of devices to gravitate towards charge neutrality over time.

Consequently, it is common to encounter erroneous or corrupted data bits at the time of reading non-volatile memory. Typically, some form of error correction control (ECC) is applied to correct erroneous or corrupted data. One common control stores additional parity bits to set the parity of a group of data bits to a required logical value when the data is written. The informational and parity bits form an encoded word stored during the write process. The ECC decodes the bits by computing the parity of the group of bits when reading the data to detect any corrupted or erroneous data. Despite these considerations, there remains a need for improved read, erase, and program operations in on-volatile memory.

BRIEF DESCRIPTION OF THE DRAWINGS

FIGS. 5A and 5B are cross-sectional and perspective views of a three-dimensional NAND memory array.

FIGS. 12A-12E depict various threshold voltage distributions and describe a process for programming non-volatile memory.

FIG. 18 is a graph describing the effects of open block reading and closed block reading.

FIG. 20 is a table including bias conditions for partial block erase verification in accordance with one embodiment.

DETAILED DESCRIPTION

Figure 1:
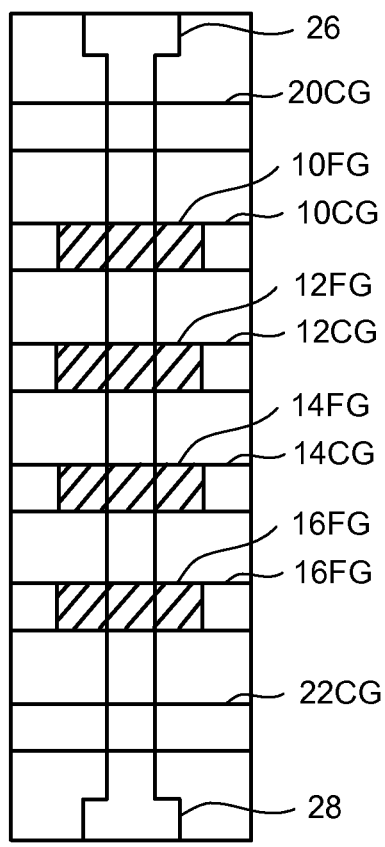
FIG. 1 is a top view of an example of a NAND string.

A non-volatile memory system mitigates potential disturbance of non-volatile storage elements that results from open block reading. In a block-based non-volatile memory architecture, a first subset of word lines may be programmed for a block, followed by reading from the programmed region of the block before a second subset of word lines are programmed for the block. This scenario results in an open block status between the time the first subset of word lines is programmed and the second subset of word lines is programmed. Reading from the block before programming the second subset of word lines may be referred to as an open block read. Reading from a memory block that has an open block status may result in read disturbance of the memory cells in the un-programmed region. To mitigate the effects of these read disturbances, a partial block erase and/or limitations on programming in the un-programmed region of the memory block may be used.

After a first subset of word lines is programmed from a block, reading from the first subset of word lines may result in read disturbance for a second subset of word lines in an un-programmed region of the block having memory cells in an erased state. Reading from the programmed region of a NAND string, for example, may utilize one or more pass voltages for the unselected word lines during the read operation. In some cases, these pass voltages may result in read disturbance by soft programming the unselected word lines. In an open block read applying a pass voltage to the un-programmed region of the block may inadvertently soft program the memory cells in the un-programmed region. In some cases, this may result in an erased memory cell moving close to or within a range of threshold distributions for a programmed state. Other shifts in threshold voltages of other states following additional programming as well as additional disturbances may occur.

A non-volatile system is provided that utilizes a partial block erase and/or limitations on programming in an un-programmed region of a memory block. In one embodiment, these techniques may result in mitigation of the effects of read or other disturbances within the block at an un-programmed region, for example. After a memory block with an open block status is read, the system responds to a subsequent programming request by analyzing the potential for read disturbance in the un-programmed region of the block. If potential read disturbance is detected, the system can perform a partial block erase for the un-programmed region and/or limit programming in the un-programmed region.

In one embodiment, the non-volatile memory system responds to a programming request associated with an un-programmed region of a memory block by performing a partial block erase verification for the memory block and/or determining a read count associated with the programmed region of the block. For example, the system may determine whether the read count for the programmed region is above a threshold. If the read count is below the threshold, the system can program the un-programmed region in response to the programming request. If the read count is above the threshold, the system can mitigate the effects of disturbance by performing a partial block erase and/or limiting programming in the un-programmed region. In another example, the system may determine if the memory block passes a partial block erase verification without determining a read count. In one embodiment, the non-volatile memory system performs partial block erase verification by verifying memory cells in at least a portion of the un-programmed region for an erased state while excluding the memory cells in at least a portion of the programmed region from verification. If the block passes verification, the un-programmed region can be programmed. If the block does not pass verification, the system can perform a partial block erase and/or limit programming in the un-programmed region. In another example, the system may respond to a read count being above the threshold by performing the partial block erase verification. If the block passes, the un-programmed region can be programmed. If the block does not pass, a partial block erase can be performed and/or programming in the un-programmed region can be limited.

If the memory block fails partial block erase verification and/or has a read count above the threshold, the system may perform a partial block erase by erasing at least a portion of the memory cells in the un-programmed region while inhibiting the programmed memory cells from being erased. For example, the system may apply an erase enable voltage (e.g., 0V or ground) to one or more word lines in the un-programmed region while applying an erase inhibit voltage to one or more of the word lines in the programmed region. The system can float or apply a positive voltage at or near the erase voltage pulse to inhibit erasing in the programmed region. Variations of the enable and inhibit voltages may be used.

If the memory block fails partial block erase verification and/or has a read count above the threshold, the system may alternatively limit programming in the un-programmed region of the memory block. For example, the system may respond to the programming request associated with the un-programmed region by programming the user data in an alternate block of the memory array. In another example, the system may respond to the programming request by programming one or more upper pages in the un-programmed region while skipping or programming dummy data for one or more lower pages in the un-programmed region. In another example, the system may weakly erase the un-programmed region of the memory block, and limit programming in the un-programmed region.

Figure 2:
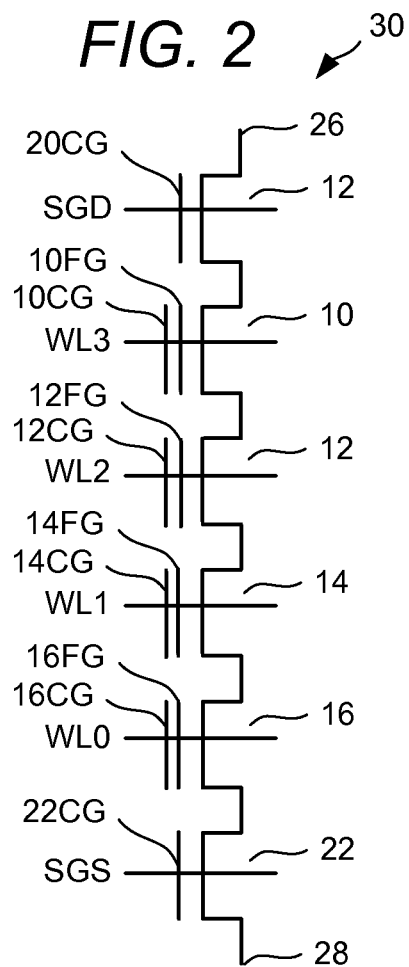
FIG. 2 is an equivalent circuit diagram of the NAND string of FIG. 1.

One example of a flash memory system uses the NAND structure, which includes multiple transistors arranged in series between two select gates. The transistors in series and the select gates are referred to as a NAND string. FIG. 1 is a top view showing one NAND string 30. FIG. 2 is an equivalent circuit thereof. The NAND string depicted in FIGS. 1 and 2 includes four transistors 10, 12, 14 and 16 in series between a first select gate 12 and a second select gate 22. Select gate 12 connects the NAND string to bit line 26. Select gate 22 connects the NAND string to source line 28. Select gate 12 is controlled by applying appropriate voltages to control gate 20CG via selection line SGD. Select gate 22 is controlled by applying the appropriate voltages to control gate 22CG via selection line SGS. Each of the transistors 10, 12, 14 and 16 includes a control gate and a floating gate, forming the gate elements of a memory cell. For example, transistor 10 includes control gate 10CG and floating gate 10FG. Transistor 12 includes control gate 12CG and a floating gate 12FG. Transistor 14 includes control gate 14CG and floating gate 14FG. Transistor 16 includes a control gate 16CG and a floating gate 16FG. Control gate 10CG is connected to word line WL3, control gate 12CG is connected to word line WL2, control gate 14CG is connected to word line WL1, and control gate 16CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, etc. The discussion herein is not limited to any particular number of memory cells in a NAND string. Other types of non-volatile memory in addition to NAND flash memory can also be used in accordance with embodiments.

Figure 3:
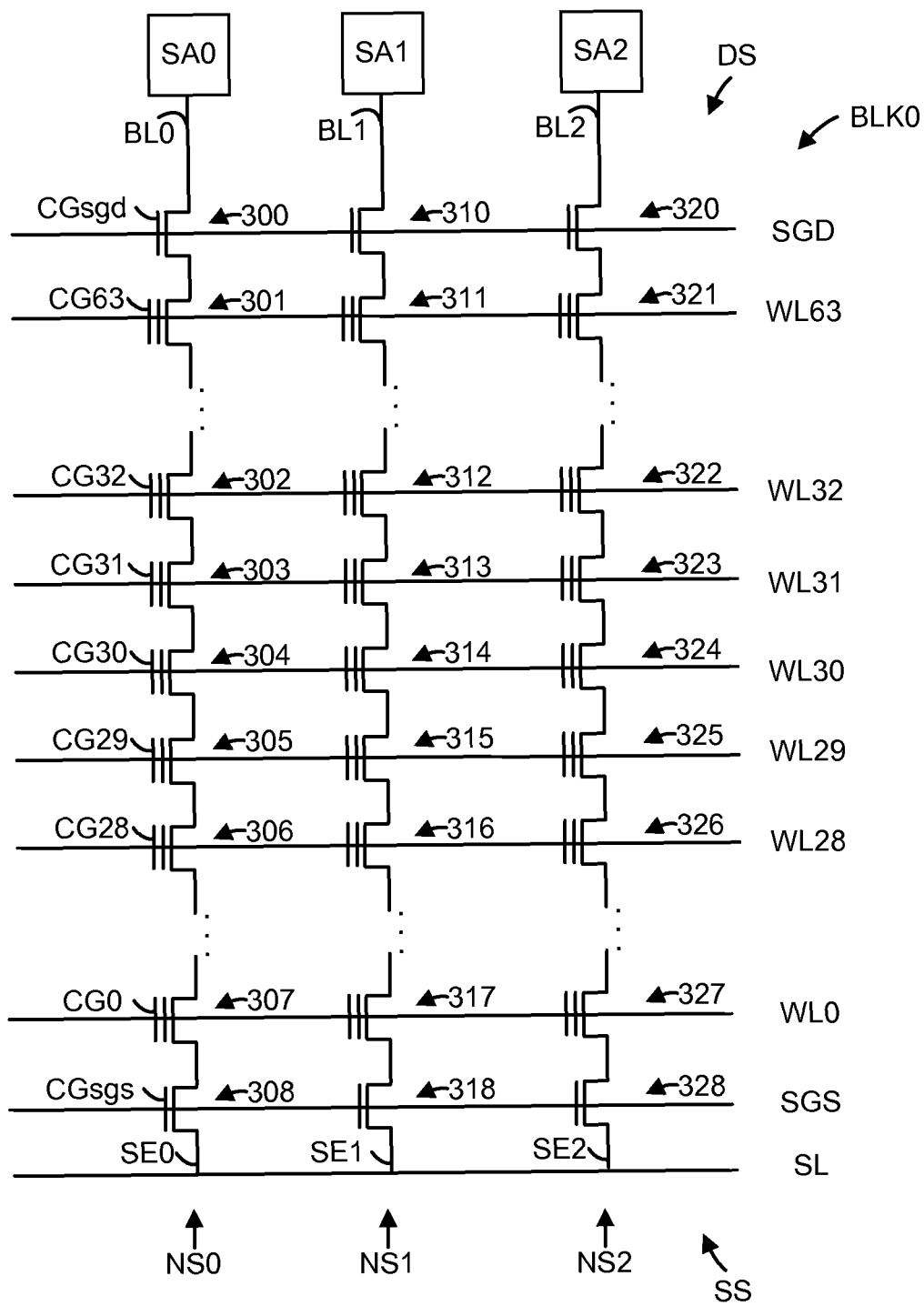
FIG. 3 is a block diagram of an example of three NAND strings in a block of non-volatile storage elements.

Typical architectures for flash memory using NAND structures include many NAND strings. FIG. 3 depicts three NAND strings such as shown in FIGS. 1-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of non-volatile storage elements. Each NAND string is connected at one end to a select gate drain (SGD) transistor, and the control gates of the SGD transistors are connected via a common SGD line. The NAND strings are connected at their other end to a select gate source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

NAND string NS0 includes storage elements 301, . . . , 302-306, . . . , 307 with respective control gates CG63, . . . CG32-CG28, . . . CG0, an SGS transistor 308 with a control gate CGsgs and a SGD transistor 300 with a control gate CGsgd. NAND string NS1 includes storage elements 311, . . . , 312-316, . . . , 317, an SGS transistor 318 and a SGD transistor 310. NAND string NS2 includes storage elements 321, . . . , 322-326, . . . , 327, an SGS transistor 328 and a SGD transistor 320. NAND strings NS0, NS2, . . . are even numbered, and NAND strings NS1, NS3 (not shown), . . . are odd numbered. Similarly, bit lines BL0, BL2, . . . are even numbered, and the NAND strings BL1, BL3 (not shown), . . . are odd numbered. The storage elements can store user data and/or non-user data.

Figure 4:
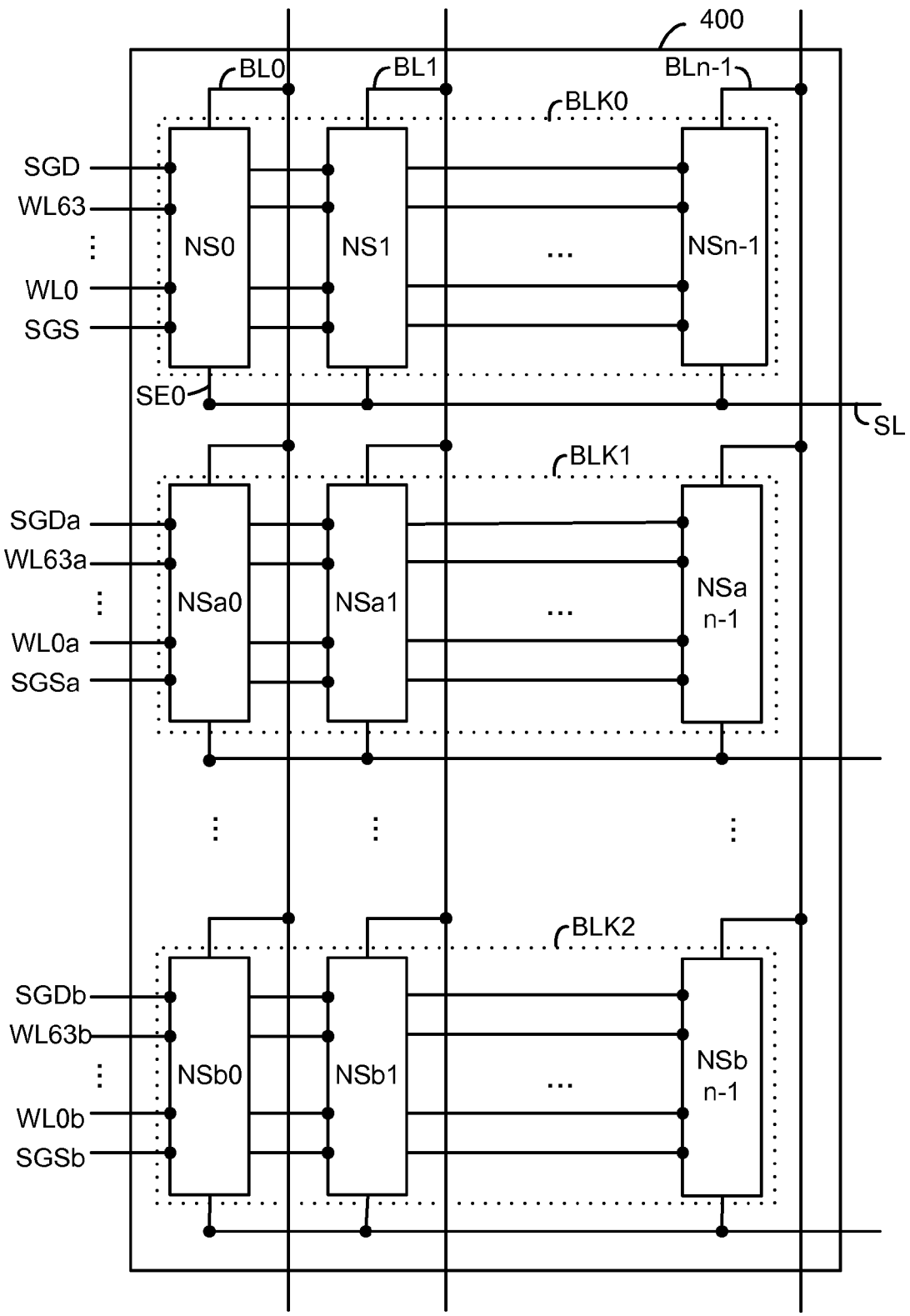
FIG. 4 is a block diagram of an array of NAND flash memory cells arranged into blocks.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of storage elements is divided into a large number of blocks (e.g., BLK0-BLK2) of storage elements, where each block includes a set of one or more NAND strings in communication with a common set of word lines, SGS line and SGD line. Each NAND string is also in communication with a respective bit line. For example, BLK0 includes NAND strings NS0, NS1, . . . , NSn−1 in communication with BL0, BL1, . . . BLn−1, respectively, and with WL0-WL63 SGS and SGD. BLK1 includes NAND strings NSa0, NSa1 NSan−1 in communication with BL0, BL1, . . . BLn−1, respectively, and with WL0a-WL63a, SGSa and SGDa. BLK2 includes NAND strings NSb0, NSb1, . . . , NSbn−1 in communication with BL0, BL1, . . . BLn−1, respectively, and with WL0b-WL63b, SGSb and SGDb.

It is common for flash EEPROM systems to utilize a block as the unit of erase, which may be referred to as an erase block or physical block. Each block can contain the minimum number of memory cells that are erased together, although multiple blocks may be erased simultaneously. Smaller units of cells may be erased together in some implementations. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring storage elements), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

FIGS. 5A-5B depict examples of three-dimensional NAND stacked non-volatile memory devices including arrays of alternating conductive and dielectric layers disposed above substrates as may also be used in accordance with embodiments. A memory hole is drilled in the layers to define many memory layers simultaneously. A NAND string is then formed by filling the memory hole with appropriate materials. Control gates of the memory cells are provided by the conductive layers. Each NAND string has a first "drain" end coupled via a drain-side select gate transistor ("SGD") to a bit line, and a second "source" end coupled via a source-side select gate transistor ("SGS") to a common source conductor. SGD and SGS may be used to selectively couple the drain and source ends, respectively, of a NAND string to the bit line and source line, respectively.

FIG. 5A illustrates a TCAT (Terabit Cell Array Transistor) array 50a, and FIG. 5B illustrates a BiCS (Bit Cost Scalable) array 50b. TCAT array 50a includes a NAND string 52a disposed above a substrate 54a. NAND string 52a has a drain end 56a coupled via SGD 58a to a bit line 60a, and a source end 62a coupled via SGS 64a to a source line 66a. BiCS array 110b includes a NAND string 112b disposed above a substrate 114b. NAND string 52b has a drain end 56b coupled via SGD 58b to a bit line 60b, and a source end 62b coupled via SGS 64b to a source line 66b.

Select gates SGD 116a and SGS 120a, and SGD 16b and SGS 120b are implemented above substrates 114a and 114b, respectively. SGD 116a and SGS 120a, and SGD 116b and SGS 120b consume a significant amount of area. Other 3D NAND non-volatile memory devices may include select gate transistors (SGD or SGS) disposed in the substrate below the NAND strings. In particular, 3D NAND memory arrays may include buried word lines as selector devices of select gate transistors (SGD or SGS).

One approach to erasing in a 3D stacked non-volatile memory device is to generate gate induced drain leakage (GIDL) current to charge up the NAND string channel, raise the channel potential to an erase voltage, and maintain this channel potential during erase. In one approach, the memory device includes NAND strings which have a drain-side select gate (SGD) transistor on one end and a source-side select gate (SGS) transistor on the other end. The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

Figure 6:
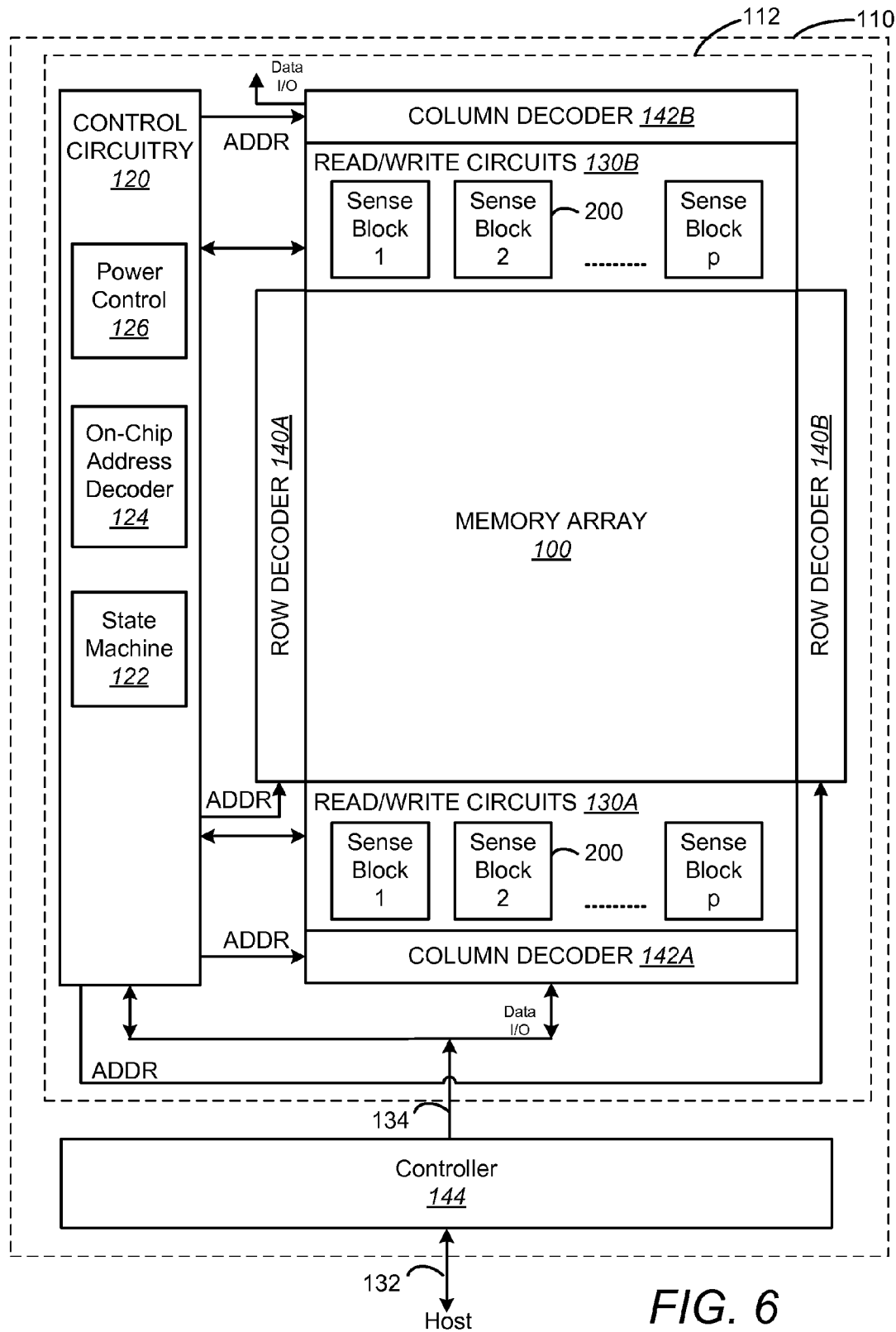
FIG. 6 is a block diagram of a non-volatile memory system in accordance with one embodiment.

FIG. 6 illustrates a memory device 110 having read/write circuits for reading and programming a page of memory cells in parallel. Memory device 110 may include one or more memory die or chips 112. Memory die 112 includes a two-dimensional or three-dimensional array of memory cells 100. Control circuitry 120 and read/write circuits 130A and 130B are provided. In the embodiment of FIG. 6, access to the memory array 100 by the various peripheral circuits is implemented in a symmetric fashion, on opposite sides of the array, so that the densities of access lines and circuitry on each side are reduced by half. In other embodiments, the various peripheral circuits may be provided in a non-symmetric fashion on single sides of the array. The read/write circuits 130A and 130B include multiple sense blocks 200 which allow a page of memory cells to be read or programmed in parallel. The memory array 100 is addressable by word lines via row decoders 140A and 140B and by bit lines via column decoders 142A and 142B. In a typical embodiment a controller 144 is included in the same memory device 110 (e.g., a removable storage card or package) as the one or more memory die 112. Commands and data are transferred between the host and controller 144 via lines 132 and between the controller and the one or more memory die 112 via lines 134.

The control circuitry 120 cooperates with the read/write circuits 130A and 130B to perform memory operations on the memory array 100. The control circuitry 120 includes a state machine 122, an on-chip address decoder 124 and a power control module 126. The state machine 122 provides chip-level control of memory operations. The on-chip address decoder 124 provides an address interface between that used by the host or a memory controller to the hardware address used by the decoders 140A, 140B, 142A, and 142B. The power control module 126 controls the power and voltages supplied to the word lines and bit lines during memory operations. Managing circuitry for memory array 100 can be considered to comprise one or more of the control circuitry 120, row decoders 140, column decoders 142, read/write circuits 130, or controller 144, for example.

Figure 7:
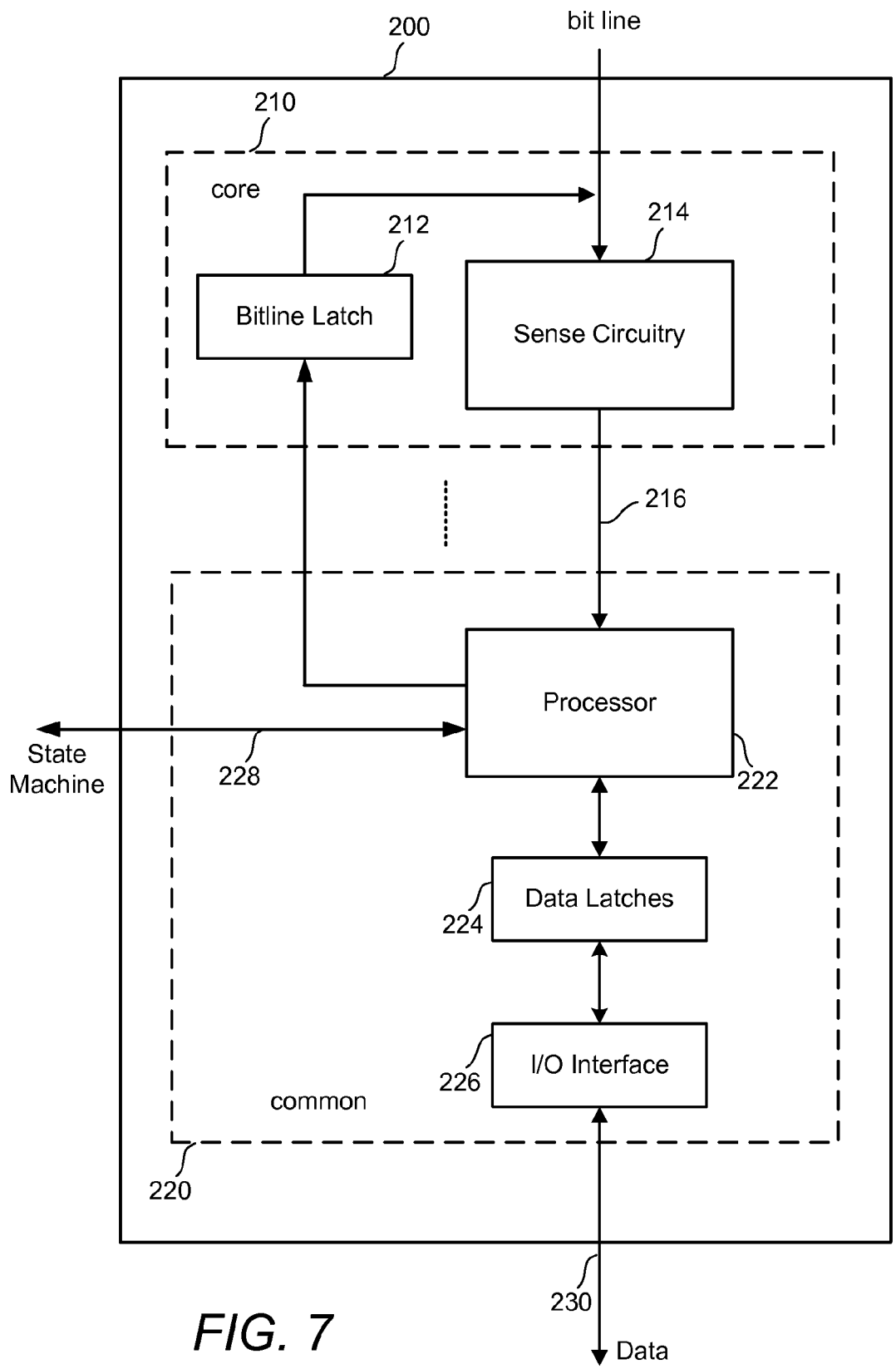
FIG. 7 is a block diagram of a sense block in accordance with one embodiment.

FIG. 7 is a block diagram of an individual sense block 200 partitioned into a core portion, referred to as a sense module 210, and a common portion 220. In one embodiment, there is a separate sense module 210 for each bit line and one common portion 220 for a set of multiple sense modules 210. In one example, a sense block will include one common portion 220 and eight sense modules 210. Each of the sense modules in a group will communicate with the associated common portion via a data bus 216.

Sense module 210 comprises sense circuitry 214 that determines whether a conduction current in a connected bit line is above or below a predetermined threshold level. Sense module 210 also includes a bit line latch 212 that is used to set a voltage condition on the connected bit line. For example, a predetermined state latched in bit line latch 212 will result in the connected bit line being pulled to a state designating program inhibit (e.g., $V_{DD}$).

Common portion 220 comprises a processor 222, a set of data latches 224 and an I/O Interface 226 coupled between the set of data latches 224 and data bus 230. Processor 222 performs computations. For example, one of its functions is to determine the data stored in the sensed memory cell and store the determined data in the set of data latches. The set of data latches 224 is used to store data bits determined by processor 222 during a read operation. It is also used to store data bits imported from the data bus 230 during a program operation. The imported data bits represent write data meant to be programmed into the memory. Data read from a cell is stored in the set of data latches before being combined with additional data and sent to the controller via I/O interface 226.

During read or sensing, the operation of the system is under the control of state machine 122 that controls the supply of different control gate voltages to the addressed cell. During convention sensing, the state machine steps through the various predefined control gate voltages corresponding to the various memory states supported by the memory. The sense module 210 may trip at one of these voltages and an output will be provided from sense module 210 to processor 222 via bus 216. At that point, processor 222 determines the resultant memory state by consideration of the tripping event(s) of the sense module and the information about the applied control gate voltage from the state machine via input lines 228. It then computes a binary encoding for the memory state and stores the resultant data bits into data latches 224. In another embodiment of the core portion, bit line latch 212 serves double duty, both as a latch for latching the output of the sense module 210 and also as a bit line latch as described above.

During program or verify, the data to be programmed is stored in the set of data latches 224 from the data bus 230. The program operation, under the control of the state machine, comprises a series of programming voltage pulses applied to the control gates of the addressed memory cells. Each programming pulse is followed by a read back (verify) to determine if the cell has been programmed to the desired memory state. Processor 222 monitors the read back memory state relative to the desired memory state. When the two are in agreement, the processor 222 sets the bit line latch 212 so as to cause the bit line to be pulled to a state designating program inhibit. This inhibits the cell coupled to the bit line from further programming even if programming pulses appear on its control gate. In other embodiments the processor initially loads the bit line latch 212 and the sense circuitry sets it to an inhibit value during the verify process.

Data latch stack 224 contains a stack of data latches corresponding to the sense module. In one embodiment, there are at least four data latches per sense module 210 to store four bits of data for/from a cell. In some implementations (but not required), the data latches are implemented as a shift register so that the parallel data stored therein is converted to serial data for data bus 230, and vice versa. In the preferred embodiment, all the data latches corresponding to the read/write block of m memory cells can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Figure 8A:
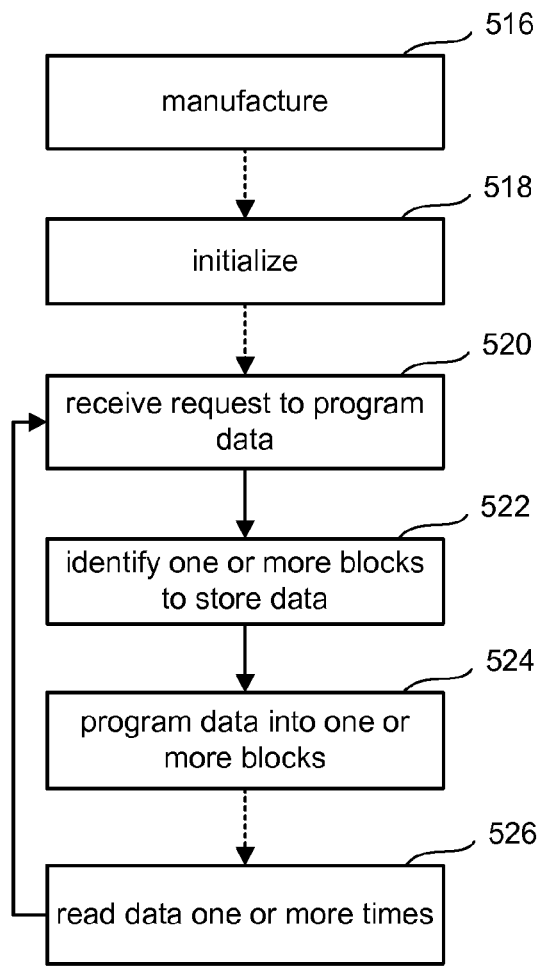
FIG. 8A is a flow chart describing one embodiment of a process for making and operating a non-volatile memory system.

FIG. 8A is a flow chart describing one embodiment of a process for making and operating a non-volatile storage system. In step 516, the non-volatile storage system is manufactured. This includes testing and (optionally) pre-loading data. In step 518, the non-volatile storage system is initialized, which can include any one or combination of powering on, configuring, waking from sleep mode, first use, or other initialization event. In step 520, a request for programming is received from the Host, the Controller or other entity. In step 522, the Controller (or state machine or other entity) will determine which set of one or more blocks to store the data. In step 524, the data received for the request is programmed into one or more blocks of memory cells. In step 526, the data can be read. The programming and reading can be performed multiple times, in any order.

The dashed line between steps 516 & 518, 518 & 520 and 524 & 526 indicates that there can be an unpredictable amount of time between the steps. Note that the steps of the process of FIG. 8A (as well as the other processes in the other Figures) need not be performed by the same entity, or in the same order as depicted.

Figure 8B:
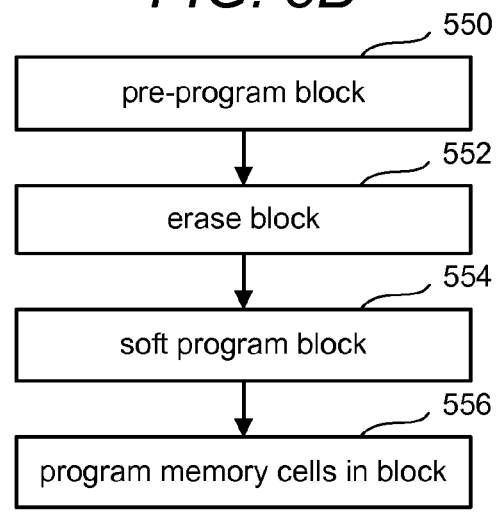
FIG. 8B is a flow chart describing one embodiment of a process for programming data into a block of memory cells.

FIG. 8B is a flow chart describing a process for programming a block of memory. The process of FIG. 8B is performed one or more times during step 524 of FIG. 8A. In one example implementation, memory cells are pre-programmed in order to maintain even wear on the memory cells (step 550). In one embodiment, the memory cells are pre-programmed to the highest data state, a random pattern, or any other pattern. In some implementations, pre-programming need not be performed. Some embodiments do not implement pre-programming.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. In blocks that are not selected to be erased, word lines are floated. Due to capacitive coupling, the unselected word lines, bit lines, select lines, and the common source line are also raised to a significant fraction of the erase voltage thereby impeding erase on blocks that are not selected to be erased. In blocks that are selected to be erased, a strong electric field is applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of a selected cell is lowered. Erasing can be performed on the entire memory array, on individual blocks, or another unit of memory cells. In one embodiment, after erasing the memory cells, all of the erased memory cells in the block will be in state S0 (discussed below). One implementation of an erase process includes applying several erase pulses to the p-well and verifying between erase pulses whether the NAND strings are properly erased.

In step 554, soft programming is (optionally) performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to the erase threshold distribution. In step 556, the memory cells of the block are programmed. The programming can be performed in response to a request to program from the host, or in response to an internal process. After programming, the memory cells of the block can be read. Many different read processes known in the art can be used to read data. In some embodiments, the read process includes using ECC to correct errors. The data that is read is output to the hosts that requested the read operation. The ECC process can be performed by the state machine, the controller or another device. The erase-program cycle can happen many times without or independent of reading, the read process can occur many times without or independent of programming and the read process can happen any time after programming. The process of FIG. 7 can be performed at the direction of the state machine using the various circuits described above. In other embodiments, the process of FIG. 8B can be performed at the direction of the Controller using the various circuits described above.

At the end of a successful programming process (with verification), the threshold voltages of the memory cells should be within one or more distributions of threshold voltages for programmed memory cells or within a distribution of threshold voltages for erased memory cells, as appropriate.

Figure 9:
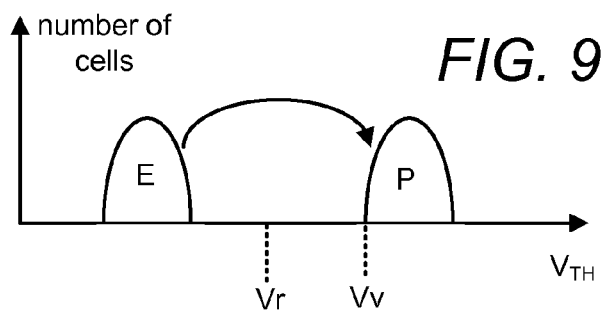
FIG. 9 depicts an example set of threshold voltage distributions and describes a process for programming non-volatile memory.

FIG. 9 illustrates example threshold voltage distributions for the memory cell array when each memory cell stores one bit of data. Other embodiments, however, may use more than one bit of data per memory cell (e.g., such as two, three, or four bits of data per memory cell). FIG. 9 shows two threshold voltage distributions (corresponding to two data states). The first threshold voltage distribution (data state) E represents memory cells that are erased. The second threshold voltage distribution (data state) P represents memory cells that are programmed. The curved arrow indicates the programming process where some memory cells are programmed to go from E to P. In one embodiment, memory cells in data state E store a logical "1" and memory cells in data state P store a logical "0." In one embodiment, the threshold voltages in E are negative and the threshold voltages in P are positive. FIG. 9, also depicts a read reference voltage Vr and verify reference voltage Vv. By testing whether the threshold voltage of a given memory cell is above or below Vr, the system can determine whether the memory cell is erased (E) or programmed (P). When programming memory cells, the system will test whether those memory cells have a threshold voltage greater than or equal to Vv.

Figure 10:
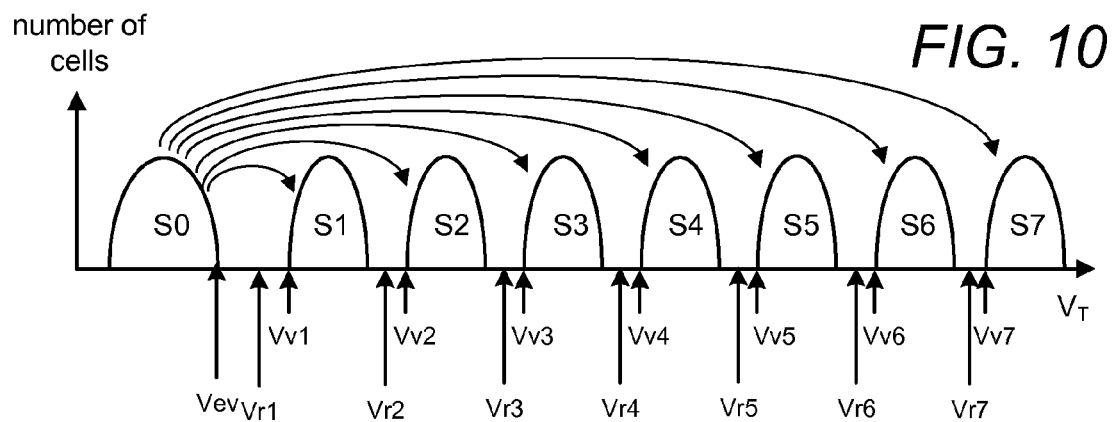
FIG. 10 depicts an example set of threshold voltage distributions and describes a process for programming non-volatile memory.

FIG. 10 illustrates example threshold voltage distributions for the memory cell array when each memory cell stores three bits of data. Other embodiments, however, may use more or less than three bits of data per memory cell (e.g., such as three bits of data per memory cell). In the example of FIG. 10, each memory cell stores three bits of data; therefore, there are eight valid threshold voltage distributions, also called data states: S0, S1, S2, S3, S4, S5, S6 and S7. In one embodiment, data state S0 is below 0 volts and data states S1-S7 are above 0 volts. In other embodiments, all eight data states are above 0 volts, or other arrangements can be implemented. In one embodiment, the threshold voltage distribution for S0 is wider than for S1-S7. In one embodiment, S0 is for erased memory cells. Data is programmed from S0 to S1-S7.

Each data state corresponds to a unique value for the three data bits stored in the memory cell. In one embodiment, S0=111, S1=110, S2=101, S3=100, S4=011, S5=010, S6=001 and S7=000. Other mapping of data to states S0-S7 can also be used. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, "Tracking Cells For A Memory System," filed on Jun. 13, 2003, describe various data encoding schemes for multi-state flash memory cells. In one embodiment, data values are assigned to the threshold voltage ranges using a Gray code assignment so that if the threshold voltage of a floating gate erroneously shifts to its neighboring threshold voltage distribution, only one bit will be affected. However, in other embodiments, Gray code is not used.

In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 10.

FIG. 10 shows a set of verify target levels Vv1, Vv2, Vv3, Vv4, Vv5, Vv6, and Vv7. These verify levels are used as comparison levels (also known as target levels and/or compare levels) during the programming process. For example, when programming memory cells to state S1, the system will check to see if the threshold voltages of the memory cells have reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Verify target level Vv2 is used for memory cells being programmed to state S2. Verify target level Vv3 is used for memory cells being programmed to state S3. Verify target level Vv4 is used for memory cells being programmed to state S4. Verify target level Vv5 is used for memory cells being programmed to state S5. Verify target level Vv6 is used for memory cells being programmed to state S6. Verify target level Vv7 is used for memory cells being programmed to state S7.

FIG. 10 also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine for which states that memory cells are storing data.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 10) or verify operation (e.g. see verify target levels Vv1, Vv2, Vv3, Vv4, Vv5, Vv6, and Vv7 of FIG. 10) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 11:
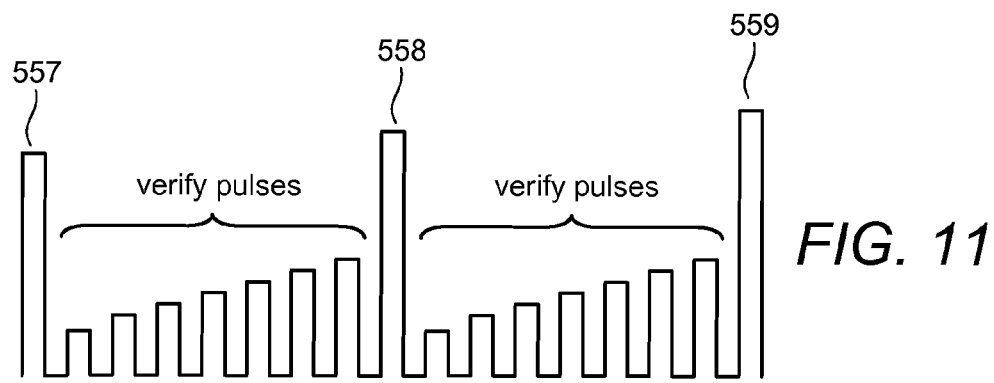
FIG. 11 depicts three programming pulses, and the verify pulses applied between the programming pulses.

In some embodiments, the program voltage applied to the control gate includes a series of pulses that are increased in magnitude with each successive pulse by a predetermined step size (e.g. 0.2 v, 0.3 v, 0.4 v, or others). Between pulses, some memory systems will verify whether the individual memory cells have reached their respective target threshold voltage ranges. For example, FIG. 11 shows a portion of a signal applied to the control gates of a plurality of memory cells connected to a common word line. FIG. 11 shows programming pulses 557, 558 and 559, with a set of verify pulses between the programming pulses. When performing full sequence programming in one embodiment, the verification process between programming pulses will test for each of the threshold voltage distribution (data states) S1-S7. Therefore, FIG. 11 shows seven verify pulses that have magnitudes corresponding to verify target levels Vv1, Vv2, Vv3, Vv4, Vv5, Vv6, and Vv7. In some embodiments, one or more of the verify operations can be skipped (and, therefore one or more of the verify pulses can be skipped) because the verify operation is not necessary or superfluous. For example, if none of the memory cells being programmed according to FIG. 10 have reached Vv2, there is no reason to verify at Vv7.

Figures 12A, 12B, 12C, 12D, 12E:
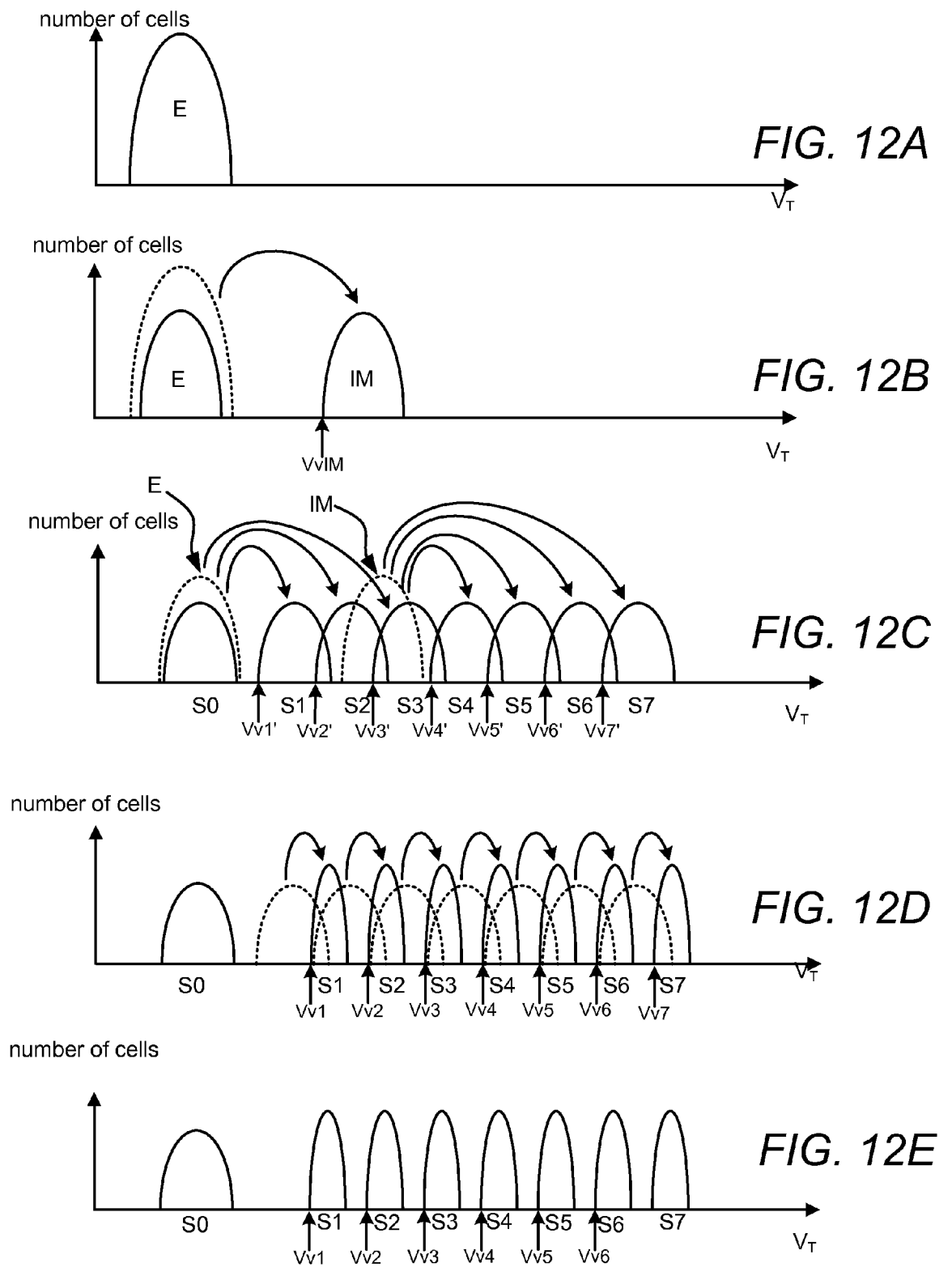

FIG. 10 shows a programming process that includes one phase where all memory cells connected to the same word line are programmed concurrently during that one phase. FIGS. 12A-E illustrates a multi-phase programming approach. In this embodiment, the programming process includes three phases. Prior to programming, the memory cells are erased so that all memory cells connected to a common word line are in an erased threshold voltage distribution E, as depicted in FIG. 12A. During the first phase of programming, those memory cells whose targets (due to the data to be stored in those memory cells) are data states S4, S5, S6 or S7 are programmed to an intermediate state IM. Those memory cells are targeted for data states S0, S1, S2 or S3 and remain in the erased threshold voltage distribution E. The first phase is graphically depicted by FIG. 11B. Memory cells being programmed to intermediate state IM are programmed to a target threshold voltage of VvIM.

During the second phase of the programming process of FIGS. 12A-E, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to data state S7, those memory cells targeted to be in data state S6 are programmed from intermediate state IM to data state S6, both memory cells to be programmed to data state S5 are programmed from intermediate state IM to data state S5, and those memory cells to be programmed to data state S4 are programmed from intermediate state IM to data state S4. This second phase of programming is illustrated in FIG. 12C. The second phase of programming may be referred to as a "foggy" programming phase.

As can be seen in FIG. 12C, at the end of the second phase of programming data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

Figures 12F, 13:
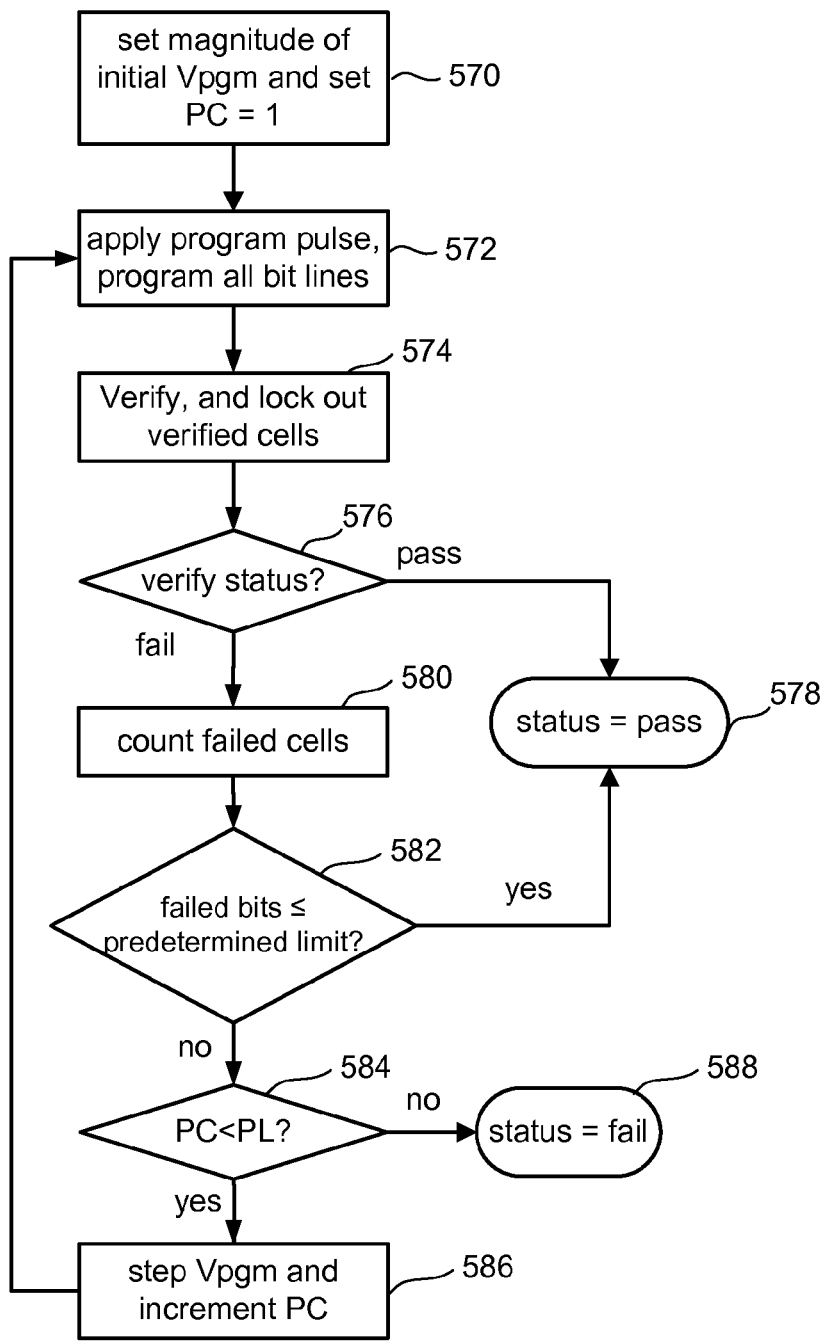
FIG. 12F is a table depicting an example data encoding.
FIG. 13 is a flow chart describing one embodiment of a process for programming non-volatile memory.

In the third phase of programming, each of data states S1-S7 are tightened so that they no longer overlap with neighboring states. This is depicted graphically by FIG. 12D. The final result of the three phrase programming process is depicted in step 11E, which shows data states S0-S7. In some embodiments, data state S0 is wider than data states S1-S7. FIG. 12F shows one example of how data is encoded for the data states of FIGS. 12A-E.

In some embodiments, those memory cells to be programmed to data state S4 are not programmed during the second phase and, therefore, remain in intermediate state IM. During the third programming phase, the memory cells are programmed from IM to S4. In other embodiments, memory cells destined for other states can also remain in IM or E during the second phase.

FIG. 13 is a flow chart describing one embodiment of a process for performing programming on memory cells connected to a common word line to one or more targets (e.g., data states or threshold voltage ranges). The process of FIG. 13 can be performed one or multiple times during step 556 of FIG. 7. For example, the process of FIG. 13 can be used to program memory cells from erased data state E to programmed data state P of FIG. 9; from data state S0 of FIG. 10 to any of data states S1-S7 performing full sequence programming, and any stage of the multi-stage programming process of FIGS. 12A-12E.

Typically, the program voltage applied to the control gate during a program operation is applied as a series of program pulses. Between programming pulses are a set of verify pulses to perform verification, as depicted (for example) in FIG. 11. In many implementations, the magnitude of the program pulses is increased with each successive pulse by a predetermined step size. In step 570 of FIG. 13, the programming voltage (Vpgm) is initialized to the starting magnitude (e.g., ~12-16V or another suitable level) and a program counter PC maintained by state machine 222 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 574, the appropriate memory cells are verified using the appropriate set of target (compare) levels to perform one or more verify operations. In one embodiment, the verification process is performed by applying the testing whether the threshold voltages of the memory cells selected for programming have reached the appropriate verify compare voltage (Vv1, Vv2, Vv3, Vv4, Vv5, Vv6, and Vv7).

In step 576, it is determined whether all the memory cells have reached their target threshold voltages (pass). If so, the programming process is complete and successful because all selected memory cells were programmed and verified to their target states. A status of "PASS" is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of cells that have failed the verify process. This counting can be done by the state machine, the controller, or other logic. In one implementation, each of the sense block 300 (see FIG. 3) will store the status (pass/fail) of their respective cells. These values can be counted using a digital counter. As described above, many of the sense blocks have an output signal that is wire-Or'd together. Thus, checking one line can indicate that no cells of a large group of cells have failed verify. By appropriately organizing the lines being wired-Or together (e.g., a binary tree-like structure), a binary search method can be used to determine the number of cells that have failed. In such a manner, if a small number of cells failed, the counting is completed rapidly. If a large number of cells failed, the counting takes a longer time. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 586, the process loops back to step 572 and another program pulse is applied to the selected word line.

Figure 14:
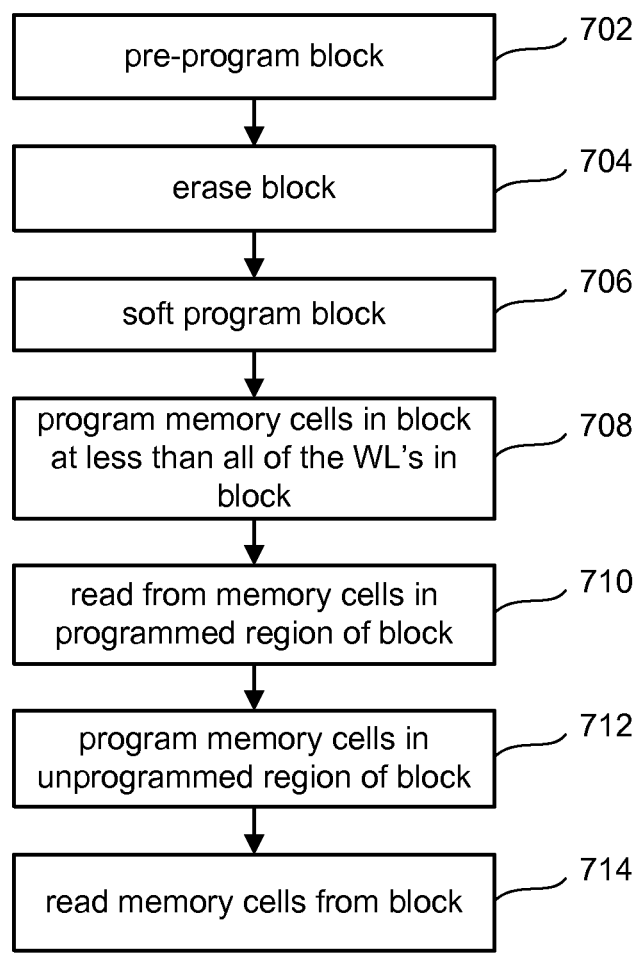
FIG. 14 is a flow chart describing one embodiment of a process for programming data into a block of memory cells.

FIG. 14 is a flowchart describing a variation of the programming process of FIG. 8B that includes an intervening read between programming portions of the memory block. The memory cells of the block are pre-programmed at step 702, followed by erasing the block at step 704, and soft programming the block at step 706, as earlier described. At step 708, the memory block is again programmed. In this case, however, the programming at step 708 is for fewer than all of the word lines in the block. For example, the programming request from the host device or controller may only require a portion of the block to be used to store the corresponding user data.

After programming the selected word lines of the block, one or more read operations are performed in the programmed region of the block to retrieve the user data that was programmed at step 708. After reading from the programmed region of the block, the system receives a programming request to program user data in the un-programmed region of the block. The time between programming the first portion of the block and reading from the first portion of the block may vary. Moreover, the time between reading form the first portion of the block and programming the second portion of the block may vary. The system programs all or a portion of the un-programmed region of the block at step 712. At step 714, the system reads from the block, including the word lines programmed initially in step 708 and/or the word lines programmed secondarily at step 712.

Figure 15A:
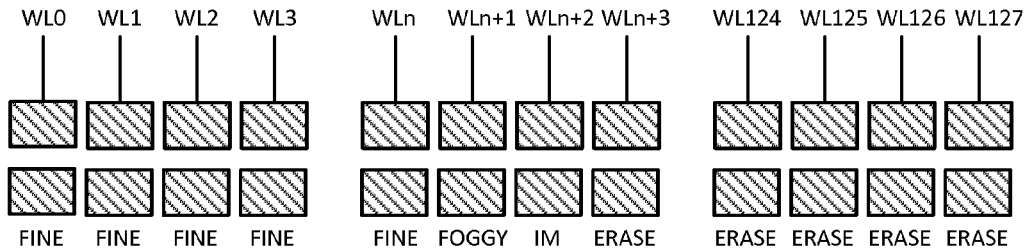
FIGS. 15A-15C are block diagrams depicting a word line status and bias conditions associated with programming, open block reading, and closed block reading, of a NAND string.
Figure 15B:
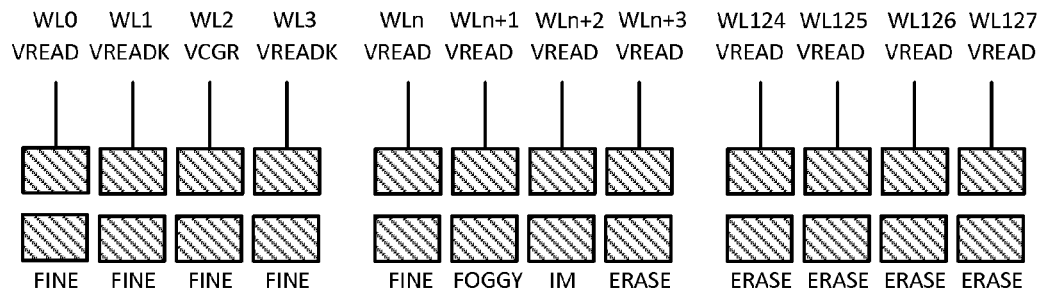
Figure 15C:
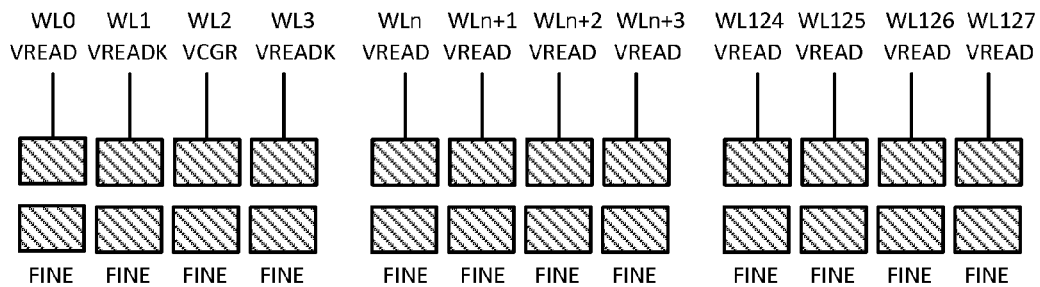

FIGS. 15A-15C are cross-sectional views of a portion of a NAND string at various stages of the process in FIG. 14 in one example. The NAND string in this example includes 128 word lines per block but NAND strings of any size and variation may be used, including those with dummy word lines as earlier described. FIG. 15A depicts the NAND string after programming a portion of the block including less than all of the word lines in the block. The status of each word line is shown below the corresponding memory cells. The notation "FINE" refers to a memory cell or word line that has completed all programming phases to its final target state for all pages of the word line. The notation "FOGGY" refers to a memory cell or word line that has completed some but not all the phases for the final target state to which it is to be programmed. The notation "IM" refers to a memory cell or word line that has been programmed to an intermediate state "IM," but has not been programmed to the final state to which it is targeted. For example, a word line that has completed all phases as shown in FIG. 12E may have a FINE programming status, a word line as shown in FIG. 12C that has not completed the final programming phase may have a FOGGY status, and a word line that has been programmed to an intermediate state IM as shown in FIG. 12B may have an IM status.

In FIG. 15A, word lines WL0-WLn have completed programming of all phases to their final target states and have a status of FINE. Word line WLn+1 has undergone programming for the first two phases of a three-phase process and has a status of FOGGY. Word line WLn+2 has completed programming to an intermediate state and has a status IM. Word lines WLn+3 through WL127 have not undergone any programming since the erase at step 552 and have a status of ERASE. The group of word lines that have been at least partially programmed including word lines WL0 through WLn+2 in this example may be referred to collectively as a subset of programmed word lines. The word lines that have not undergone any programming since a last erase operation may be referred to collectively as a subset of un-programmed or erased word lines.

FIG. 15B depicts the status of each word line and the bias condition for the word line during a read operation for one of the word lines in the first group of word lines that are at least partially programmed. The read operation follows sometime after programming the first group of word lines as shown in FIG. 15A. Thus, the status of each of the memory cells or word lines is the same as in FIG. 15A. In this example, word line WL2 is read. As indicated in FIG. 15B, word line WL2 may be read a number of times m. This type of read operation is often referred to as an open block read operation because the block is only partially programmed. A first subset of word lines including word lines WL0 through WLn+1 have been programmed (at least partially) while a second subset of word lines have not been programmed and remain in the erased or un-programmed state. In FIG. 15B and hereafter, an open block read when a block has only been partially programmed is denoted as RD1.

The bias conditions for the word lines during an example of an RD1 read operation are also depicted in FIG. 15B. In this example, the selected word line WL2 receives the read voltage VCGR which may be applied at one of the read compare levels shown in FIG. 10. Word lines WL1 and WL3 that are adjacent to the selected word line WL2 receive a read pass voltage VREADK and the remaining word lines receive a read pass voltage VREAD. VREAD is a read pass voltage applied at a level sufficient to turn on a cell in any of the programmed states. For example, VREAD may be applied at a level above the highest expected threshold voltage of a memory cell in the highest programmed state. VREADK is also a read pass voltage that is applied to turn on a memory cell in any programmed state. VREADK (e.g., 6.8V) may be applied at a level higher than VREAD (e.g., 6.0V) to compensate for a lower voltage at the adjacent word lines due to the lower VCGR voltages being applied to the selected word line. The remaining word lines are each adjacent to another word line receiving the VREAD voltage. VREADK may be equal to VREAD in another example.

After reading WL2 m times, and/or other programmed word lines any number of times, the block is closed by programming the erased word lines in response to a second programming request from the controller or a host device. In addition to programming the erased word lines, the partially programmed word lines may be programmed after the RD1 read operation(s). The word lines in the first subset that were programmed in an intermediate stage (e.g., WLn+2) or at less than all the stages for their final state (e.g., WLn+1) can be programmed.

After closing the block by programming the second subset of word lines and the partially programmed word lines, the status of the word lines is as shown in FIG. 15C. In FIG. 15C, each memory cell or word line has a FINE programming status indicating that every word line of the block has been programmed to its final target state using a final verify level. FIG. 15C also depicts the bias conditions to read from WL2 during a read operation RD2 after closing the block. The bias conditions are the same as shown in FIG. 15B. Read operations using the same bias conditions may be performed on other word lines, including those in the second subset that were originally erased during the read operation RD1.

The open block read operation depicted in FIG. 15B may lead to read disturb on the erased word lines by inadvertently soft programming the memory cells coupled to the erased word lines. As shown in FIG. 15B, the read pass voltage VREAD is applied to the erased word lines during the open block read operation. The read pass voltage is a large voltage sufficient to turn on a memory cell in the highest programmed state. When the high read pass voltage VREAD is applied to the control gate of an erased memory cell, it may inadvertently soft or partially program the erased memory cell by injecting electrons into the erased memory cells, thereby raising their threshold voltage. Because the threshold voltage of the memory cells is raised, these cells are at a higher state level than anticipated before being programmed in response to the second programming request. The shift in threshold voltage may be enough to cause cells that are to remain in the erased state after the second programming operation to move into the state S1 or first programmed state distribution level. This read disturb effect causes these cells to be read as in state S1, rather than their intended erased state (or state S0). Additionally, the shift may be so high that cells are read as state S2 or even higher, when in fact their intended states were lower such as S0 or S1.

Figure 16:
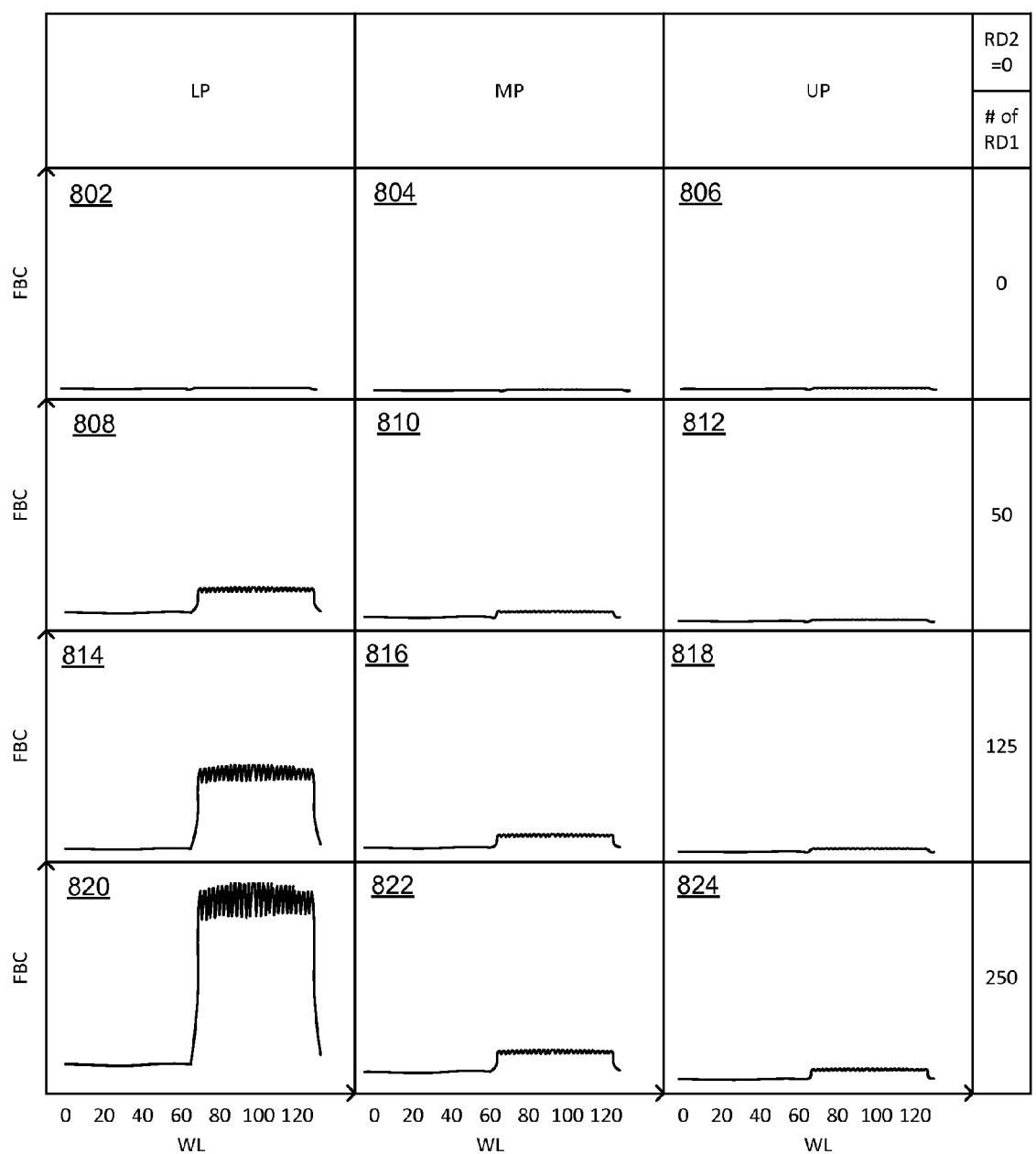
FIG. 16 is a set of graphs describing the effects of open block reading.

FIG. 16 is a diagram depicting the results of a simulation to illustrate the effects of open block reading RD1 on a group of memory cells. FIG. 16 includes twelve graphs depicting the average fail bit count (FBC) for a group of memory cells when reading from the group of memory cells. The group of memory cells may include one or more blocks of memory cells, for example. Twelve graphs are shown in FIG. 16. Each graph depicts the average fail bit count (FBC) for the group of memory cells as a function of the word line to which the cells are coupled.

In this simulation, the group of memory cells is programmed from word line WL0 to WL63 prior to performing zero or more open block read operations. WL63 is partially programmed with intermediate state data, word line WL62 is partially programmed with final state data at less than all the intended programmed passes, and word lines WL0 through WL61 are fully programmed to their final target levels. Word lines WL64-WL127 are un-programmed, remaining in the erased state.

Three columns are shown in FIG. 16. The first column includes graphs 802, 808, 814, 820, and shows the average FBC for the lower page of data when reading from each of the word lines. The second column includes graphs 804, 810, 816, 822, and shows the average FBC for the middle page of data when reading from each of the word lines. The third column includes graphs 806, 812, 818, 824, and shows the average FBC for the upper page of data when reading from each of the word lines.

The simulation was conducted in four different scenarios shown in the fourth column of FIG. 16. The fourth column shows a number of RD1 read operations performed for the programmed word lines WL0-WL63 before closing the block and programming word lines WL64-WL127. No read operations were performed for the block after closing the block (i.e., # of RD2=0) and before testing for a bit failure.

Thus, the upper set of graphs 802, 804, and 806 depicts the average FBC for a lower page LP, middle page MP, and upper page UP of data, respectively. Each of the graphs in the upper set shows the average FBC when no open block read operations are performed on the group of memory cells. As shown in graphs 802, 804, and 806, word lines WL0 through WL127 all show relatively equal amounts of bit failure for all three pages of data.

The next row of graphs 808, 810, and 812 illustrates the average FBC if the group of word lines is read fifty times (i.e., # of RD1=50) before closing the block by programming word lines WL64 through WL127. Graph 808 illustrates that the average FBC for the lower page of data beginning at around word line WL64 has increased significantly due to the RD1 open block read. Similarly, graph 810 illustrates that the average FBC for the middle page of data has increased beginning at word line WL64. Some similar increase can even be seen for the upper page of data in graph 812.

The next row of graphs 814, 816, and 818 illustrates the average FBC of the group of word lines when the group is read 125 times (i.e., # of RD1=125) before closing the block by programming word lines WL64 through WL127. Graph 814 illustrates that the average FBC for the lower page of data beginning at around word line WL64 has again increased significantly due to the RD1 open block read. Similarly, graph 816 illustrates that the average FBC for the middle page of data has increased beginning at word line WL64. Again, an increase can be seen for the upper page of data in graph 818.

The final row of graphs 814, 816, and 818 illustrates the average FBC of the group of word lines when the group is read 250 times (i.e., # of RD1=250) before closing the block by programming word lines WL64 through WL127. Graph 820 illustrates that the average FBC for the lower page of data beginning at around word line WL64 has again increased significantly due to the RD1 open block read. Graph 822 illustrates that the average FBC for the middle page of data has increased beginning at word line WL64 and an increase can be seen for the upper page of data in graph 824.

FIG. 16 illustrates that read disturb is experienced by the memory cells of the word lines that are erased when reading from the previously programmed memory cells of other word lines. The read pass voltage that is applied to the un-programmed memory cells during the read operations causes an increase in threshold voltage of erased cells that leads to increased error levels after programming these memory cells and reading them back later. It is particularly seen that read disturb occurs on the lower page of data. This may result from cells that are to remain in the erased state after closing the block being raised to state S1 due to soft programming during the open block read.

Figure 17A:
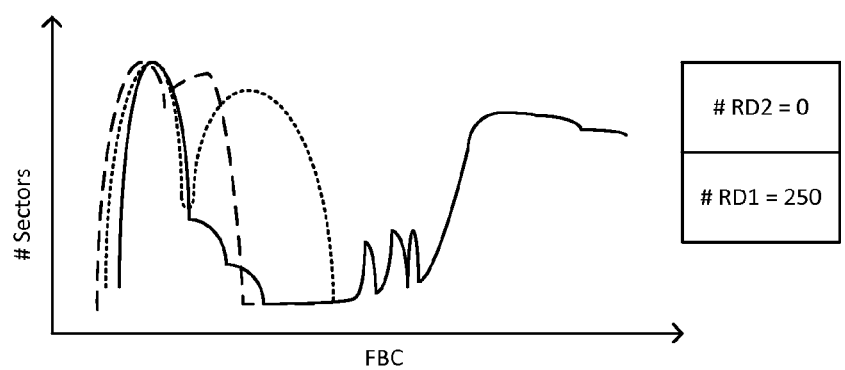
FIGS. 17A-17B are graphs describing the effects of open block reading and closed block reading.
Figure 17B:
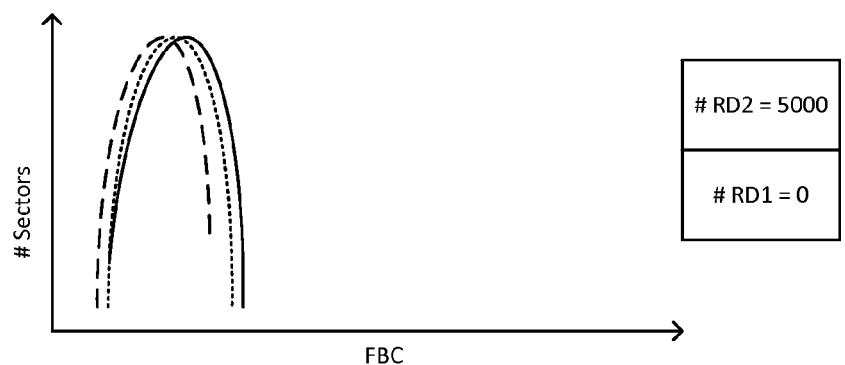

FIGS. 17A and 17B are diagrams further illustrating the effects of open block reading, and contrasting those effects with the effects of read disturb from closed block reading. FIGS. 17A and 17B include histograms depicting a distribution of fail bit counts across a group of memory sectors. In FIG. 17A, the fail bit count is shown when the number of RD1 open block reads is 250 and the number of RD2 closed block reads is zero. FIG. 17A includes three lines showing the average FBC individually for the lower pages, upper pages, and middle pages of data. In FIG. 17A each distribution includes two peaks. The left peak corresponds to the programmed word lines during the RD1 read operations and the right peak corresponds to the erased word lines during the RD1 read operations. FIG. 17A illustrates that the erased word lines during the RD1 operations have a much higher average FBC than the programmed word lines during the RD1 operations. The average FBC is lowest for the upper page and greatest for the lower page. Moreover, the lower page average FBC for the erased word lines is significantly higher than the middle and upper page average FBC for the erased word lines.

In FIG. 17B, the fail bit count is shown when the number of RD1 open block reads is zero and the number of RD2 closed block reads is 5,000. In this case, each distribution includes a single peak generally between the two peaks for the open block read example in FIG. 17A. Moreover, there are no sectors in any of the pages that have an average FBC approaching the level of the lower page in the open block read. Thus, FIGS. 17A and 17B show that open block reading leads to much higher fail bit counts when compared with regular closed block reading.

FIG. 18 is another diagram contrasting the effects of open block reading with the effects of regular closed block reading. FIG. 18 depicts the average word line read failures along the y-axis as a function of the number of regular closed block read operations RD2. The dashed line in FIG. 18 corresponds to a case where no RD1 open block reads are performed and the solid line corresponds to a case where 10,000 RD1 open block reads are performed. The solid line shows that even when the number of regular RD2 read operations is low, the average WL failure is high when a large number of open block RD1 read operations are performed. By contrast, the dashed line shows that when no open block read RD1 read operations are performed, an extremely large number of regular read operations must be performed to approach the average number of word line failures that result from open block reading. For example, it may take around 600,000 regular read operations to cause an average word line failure equal to that of just 10,000 open block read operations. Thus, the effects of a single open block read operations may be comparable to around 60 closed block read operations.

The diagrams in FIGS. 16-18 illustrate that open block reading can lead to increase in the bit error rate (BER). This may be due to read disturb that occurs for erased memory cells in the un-programmed region of a block when reading from the programmed region. The read pass voltage applied to the un-programmed word lines results in soft programming of the erased memory cells, and potentially subsequent errors when reading from these memory cells. To mitigate the effects of open block reading, the present disclosure analyzes the un-programmed region of a block before programming to determine whether read disturb has or is likely to have occurred in the un-programmed region. For example, the system may determine a read count value indicative of the number of open block reads for a block to determine that read disturb may have occurred. The system may alternatively or additionally perform a partial block erase verification to determine if the memory cells in the un-programmed region of the block are erased. If the conditions indicate that read disturb has occurred, the memory takes action to mitigate the effects of open block reading. For example, the system may perform a partial block erase to erase the un-programmed region prior to programming. The system may alternatively or additionally limit programming in the un-programmed region. The system may not program any of the pages in the un-programmed region or the system may only program certain ones of the pages in the un-programmed region.

Figure 19:
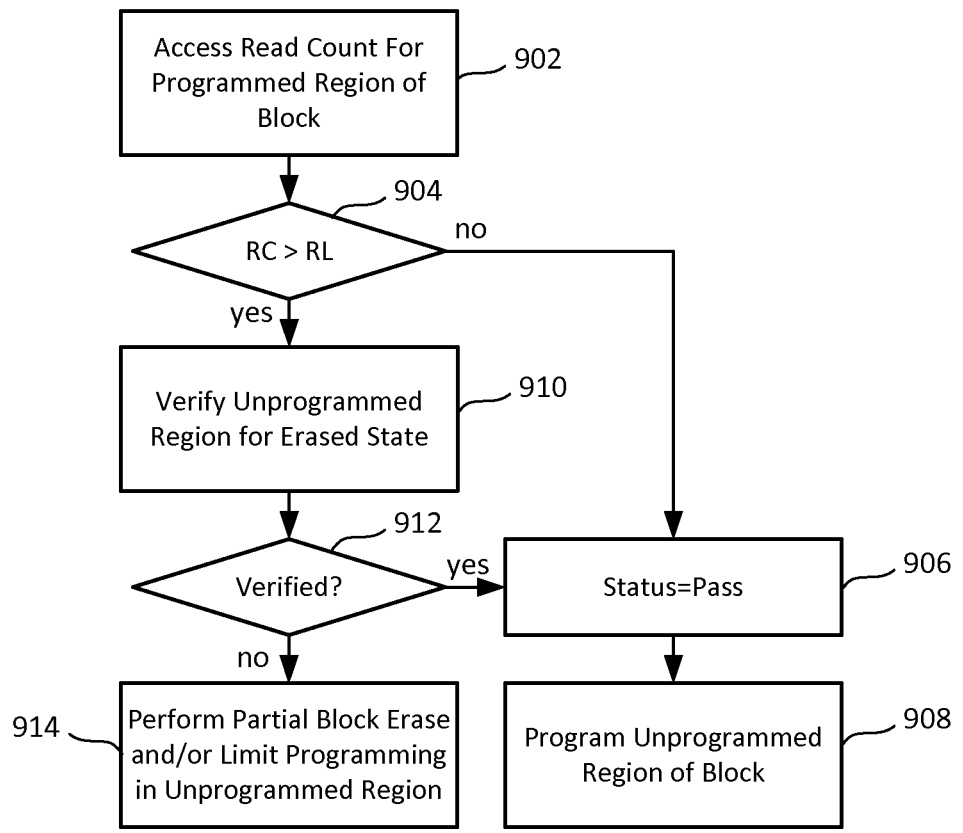
FIG. 19 is a flow chart describing one embodiment of a process for programming data into an open memory block including programmed and un-programmed regions.

FIG. 19 is a flowchart describing a process of programming an un-programmed region of a memory block in accordance with one embodiment. In one example, the process of FIG. 19 may be performed at step 712 of FIG. 14 by managing circuitry for a memory array. The process may be performed in response to a programming request from the controller and/or host to program memory cells in the un-programmed region of a block. At step 902, the number of times the block or the programmed region of the corresponding block has been read since a last erase cycle is determined. The managing circuitry can access a read count value that is updated each time the block is read in one example. At step 904, the read count (RC) is compared with a threshold such as a read limit (RL). If the read count is less than or equal to the read limit, the managing circuitry reports a status of pass at step 906. At step 908, the managing circuitry programs the un-programmed region of the block using the user data from the second programming request. The managing circuitry may also program any partially programmed word lines of the block at step 906.

If the read count RC is greater than the read limit RL, the managing circuitry verifies the un-programmed region of the block for the erased state at step 910. The managing circuitry performs a partial block erase verification as hereinafter described in one example. The managing circuitry can verify whether the un-programmed region of the block is erased, while excluding or otherwise passing the programmed region of the block from the verification. For example, the managing circuitry may apply an erase verification voltage to the un-programmed region while applying a pass voltage to the programmed region of the block. Variations of the partial block erase verification may be used.

The managing circuitry determines whether the un-programmed region of the block was successfully verified for the erased state at step 912. If the block verifies for the erased state, the managing circuitry reports a status of pass at step 906 and programs the un-programmed region in response to the programming respect at step 908.

If the un-programmed region of the block fails the erase verification, the managing circuitry performs a partial block erase for the block and/or limits programming in the un-programmed region of the block at step 914. The managing circuitry mitigates the detected effects of the partial block read operation(s) at step 914. The managing circuitry may erase all or a portion of the unprogrammed region of the block at step 914 by performing a partial block erase operation. The managing circuitry may alternatively or additionally limit programming in the un-programmed region. For example, the managing circuitry may skip programming in the un-programmed region in response to the un-programmed region failing the erase verification.

The managing circuitry may skip programming for one or more first pages in the un-programmed region while programming one or more second pages in the un-programmed region in one embodiment. For example, the managing circuitry may program one or more upper pages of data for the word lines in the un-programmed region of the block while skipping programming for one or more lower pages of data for the word lines in the un-programmed region. In a three-bit per cell example, the memory may program the upper and middle pages while skipping programming for the lower pages to avoid the effects illustrated in FIGS. 16 and 17. In a four-bit per cell example, the memory may program the two upper pages while skipping programming for the two lower pages. Other variations are possible.

It is noted that variations to the processes associated with steps 902 and 910 are possible. For example, step 902 is optional and may not be performed. Instead, the system may directly verify the un-programmed region of the block for the erased state at step 910 without checking a read count value. Likewise, step 910 is optional as the system may access the read count value and not perform an actual verification for the erased state. Other variations are possible.

FIG. 20 is a table showing examples of the bias conditions for the partial block erase verify operation that may be performed at step 910 in one embodiment. FIG. 20 continues with an example of a block including 128 word lines set forth in column 1002, but it will be appreciated that embodiments in accordance with the present disclosure may be practiced with any number of word lines. In FIG. 20, word lines WL0-WLn have completed programming of all phases for their final target state and thus, have a status of FINE as indicated in column 1004. WLn+1 represents a word line having a FOGGY status that has completed programming of some stages. WLn+2 represents a word line that has completed an intermediate programming stage which is denoted as IM in column 1004. Other programming schemes are possible that do not use FOGGY and/or intermediate programming.

The partial block erase verify bias condition for a first option are set forth in column 1006. The word lines that have been fully programmed (WL0-WLn) and the word lines that have completed a FOGGY programming stage (WLn+1) receive an erase verify pass voltage. In FIG. 20, the erase verify pass voltage is shown as Vread but other voltages may be used. Vread is a voltage that will turn on a fully programmed memory cell, including those programmed to the highest programmed state (e.g., S7).

Word lines WLn+4 through WL127 that are in the erased state receive the erase verify voltage Vev, as shown in FIG. 9 for example. The erase verify voltage is generally set to the highest acceptable threshold voltage for an erased memory cell. The first word line WLn+3 in the erased state that is adjacent to the intermediately programmed word line WLn+2 receives the intermediate pass voltage Vintev in the example of column 1006. The intermediate pass voltage may be higher than the erase verify voltage Vev. This can help ensure that the memory cells of word line WLn+2 are conductive during the erase verification. For example, a portion of the voltage at WLn+3 will couple to WLn+2 and help to turn on the memory cells of WLn+2.

FIG. 20 shows an example of bias conditions for a two-dimensional array. The bit line is floating while the source line is at $V_{DD}$. The drain select gate and source select gate lines are supplied with a positive voltage $V_{SG}$ sufficient to turn on both select gates. $V_{SG}$ is typically larger than $V_{DD}$. For example, $V_{SG}$ can be about 4-4.5V in one embodiment and $V_{DD}$ can be about 2.5V. To verify whether the memory cells in the un-programmed region are erased, the bias conditions of column 1006 are applied to a NAND string and the bit line voltage is sensed. If the memory cells are erased sufficiently deep, they will be in the on state and provide a conduction path from the source line to the bit line. A current will be induced through the NAND string and an internal sense node discharges to a certain level within a sense time. After a predetermined amount of time the internal sense node voltage is sensed or checked by a sense amplifier. If the voltage has discharges to a predetermined level, the interior memory cells are verified as erased. If the memory cells are not erased sufficiently deep, they will not be in the on state and therefore, will not conduct any current or will conduct too little current. As a result, the sense node voltage will not discharge to the predetermined level. When the voltage is sensed after the predetermined amount of time, it will not have reached the predetermined level and the memory cells will not be verified as erased. Other sensing schemes are possible. Sensing during erase verify for 3D NAND may be similar to the example of sensing during erase verify of 2D NAND. The bit line voltage may be held constant during sensing. In one embodiment, the 3D NAND string current discharges a sense node in the sense amplifier for a time period referred to as the sense time. A determination is made whether the voltage on the sense node discharges to a certain level within the sense time Column 1008 shows another option for the partial block erase verify operation. In this example, the word line that has been programmed in an intermediate stage receives a different erase verify pass voltage. In this example, WLn+2 which has completed an intermediate stage of programming receives an intermediate pass voltage Vintev. The intermediate pass voltage can be less than the Vread pass voltage because the word line will not have memory cells programmed to the highest level. For example, the memory cells may only be programmed to the intermediate state. Accordingly, a lower pass voltage may be used. In other example, WLn+2 may receive Vread. Other variations of the applied bias conditions are possible.

Figures 21, 22:
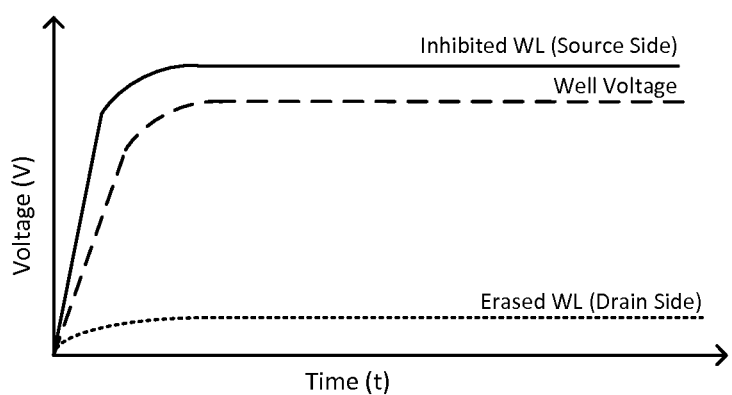
FIG. 21 is a table including bias conditions for a partial block erase in accordance with one embodiment.
FIG. 22 is a graph depicting various voltages during partial block erase in accordance with one embodiment.

FIG. 21 is a table showing examples of the bias conditions for a partial block erase operation as can be performed at step 910 in one embodiment. The status of each word line remains the same from the partial block erase verify operation. The partial block erase bias conditions for a first option are set forth in column 1010. The bit and source lines are floating as well as the source and drain select gate lines. In the case of a two-dimensional memory array, the p-well receives the erase voltage Verase which can be applied as one or more pulses having an increasing magnitude with each pulse. The word lines in the un-programmed region of the block (WLn+3 through WL127) that are to be erased are supplied with zero volts or are grounded to enable erasing for those memory cells. The word lines that have been fully programmed (WL0-WLn) and the word lines that have completed a FOGGY programming stage (WLn+1) receive an inhibit voltage Vinh. The erase inhibit voltage may be applied by floating the corresponding word lines in one example. In another example, the inhibit voltage Vinh can be applied directly to the word lines as a positive voltage. The word line WLn+2 in the intermediate programming stage IM receives an intermediate voltage Vint. Vint is a positive voltage that is less than the erase voltage potential Verase. Although less than Vinh, Vint may be sufficient to inhibit erasing of WLn+2.

Under the applied bias conditions, the word lines in the un-programmed region of the block will be erased while the word lines in the programmed region of the block are inhibited from being erased. Electrons are transferred from the floating gates of each memory cell in the un-programmed region set by virtue of the potential created by applying 0V to the word lines and Verase to the p-well. To inhibit erasing of the already programmed memory cells, the word lines in the programmed region are floated or supplied with a positive voltage while the word lines in the un-programmed region are provided with 0V. If floated, the word lines in the programmed region will couple to the p-well and create little to no erase potential across the tunnel dielectric region of the memory cells. Another possible technique is to apply a positive voltage at or near the potential of the erase voltage Verase to inhibit erasing of the word lines in the programmed region. The positive voltage will create little or no erase potential across the tunnel dielectric region to draw electrons to the p-well from the floating gate. In one example, the lower intermediate voltage Vint is supplied to WLn+2 by applying a smaller positive voltage to WLn+2 than Vinh. In another example, WLn+2 may be floated after floating the other word lines in the programmed region. In this manner, WLn+2 will be coupled to the erase voltage Verase at the p-well region (which can be applied before floating the word line) later and rise to a lower level than that of the other word lines in the programmed region. By supplying 0V to the word lines in the un-programmed region, those memory cells will be enabled for erasing. Thus, just the memory cells in the un-programmed region are erased when the erase voltage pulse is applied to the p-well to facilitate a partial block erase.

FIG. 22 illustrates the potential of the word lines and the p-well region during the partial block erase. The well voltage is raised to the erase voltage potential by applying Verase. The programmed word lines on the source side that are to be inhibited are coupled to the well voltage or supplied with a positive voltage raising the voltage to the level of the well or even above as shown in FIG. 22. On the other hand, the un-programmed word lines on the drain side that are to be enabled for erase receive 0V or are grounded. Thus, their potential rises only slightly due to capacitive coupling with the p-well. Accordingly, the memory cells of these word lines will have electrons drawn from their floating gate resulting in erase.

In a three-dimensional array, the word lines may be biased for a partial block erase in the same manner as shown in FIG. 21. One approach to erasing in a 3D non-volatile memory is to generate gate induced drain leakage (GIDL) to charge up the NAND string channel, raise the channel potential to an erase voltage, and maintain this channel potential during erase. In one example, the memory device includes NAND strings that have a drain-side select gate SGD transistor and a source-side select gate SGS transistor. The erase may be a one-sided erase or a two-sided erase. When a voltage (e.g., erase voltage) is applied to the bit line in a one-sided erase, the select gate transistors generate a sufficient amount of gate-induced drain leakage (GIDL) current to charge up the floating body (channel) of the NAND string. A voltage can be applied to the bit line and the source line in a two-sided erase to generate gate-induced drain leakage at the drain-side select gate. GIDL increases in proportion to the drain-to-gate voltage (Vdg) of the select gate transistors.

Column 1012 shows another option for the partial block erase verify operation. In this example, the first word line WLn+3 that is adjacent to the intermediately programmed word line WLn+2 receives the intermediate voltage Vint along with word line WLn+2. The intermediate voltage Vint applied at WLn+3 may help to avoid erasing WLn+2 by coupling a portion of the voltage applied at WLn+3 to WLn+2. Other variations of the applied bias conditions are possible.

Figure 23:
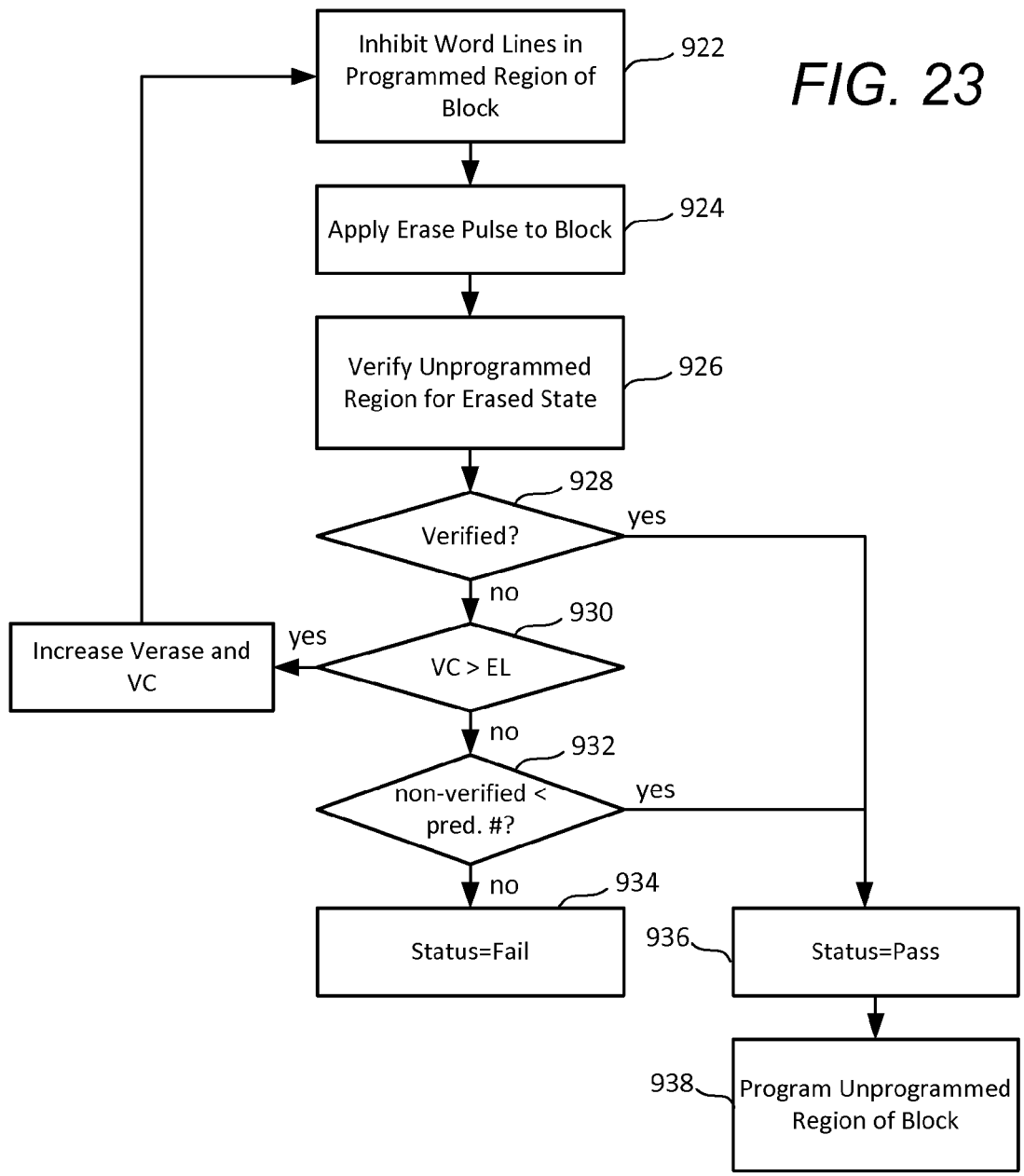
FIG. 23 is a flowchart describing a process of partial block erase in accordance with one embodiment.

FIG. 23 is flowchart describing a process of performing a partial block erase operation according to one embodiment. In one example, the process in FIG. 23 may be performed as part of step 914 in FIG. 19. At step 922, word lines in the programmed region of the memory block are inhibited from erase. The word lines in the programmed region may be floated or have a positive erase inhibit voltage applied directly to them so that they are inhibited from erase. Word lines may be floated at different times to create different amounts of erase inhibition as earlier described. Moreover, different positive erase inhibit voltages may be applied to different word lines. For example, word lines in an intermediate programming state IM may be floated after the other word lines in the programmed region so that they rise to a lower voltage by coupling with the erase voltage at the p-well. Additionally, a lower erase inhibit voltage may be applied to the word lines in the intermediate programming stage.

At step 924, the erase voltage Verase is applied to the memory block as an erase voltage pulse. In a two-dimensional memory array, Verase may be applied directly to the p-well region for the NAND strings. In a three-dimensional memory array, a positive voltage may be applied to the bit line (and optionally source line) of the NAND string and be transferred to the channel region of the NAND string through the select gates. At step 926, the un-programmed region of the memory block is verified for the erased state. Step 926 may include verifying the memory cells in the un-programmed or erased region for the erased state while excluding memory cells in the already programmed region from verification. Various erase verify pass voltages may be used in the programmed region. Moreover, an erase verify pass voltage may be used for one or more word lines (e.g., WLn+3) in the un-programmed region to aid in enabling conduction of memory cells on an adjacent word line in the programmed region (e.g., WLn+2) as earlier described.

At step 926, the managing circuitry determines whether the memory block passed partial block erase verification or whether the verification was otherwise successful. If the un-programmed region is verified for the erased state, the managing circuitry reports a status of pass for the block at step 936. At step 938, the managing circuitry programs the un-programmed region of the memory block with the user data associated with the programming request.

If the block does not pass the partial block erase verification, the managing circuitry checks verify counter VC again an erase limit EL. The verify counter is used to limit the number of iterations of the erase verify cycle. One example of an erase limit is eight; however, other limits may be used. If the verify counter is less than the erase limit, then VC is incremented by one and the value of the erase voltage pulse Verase is stepped up by a step size or increment value (e.g., 0.5V to 1.0V). The managing circuitry returns to step 922 to inhibit the word lines in the programmed region of the block and perform and additional erase at step 924.

If the verify counter is not less than the erase limit EL, the managing circuitry determines whether the number of non-verified NAND strings is less than a predetermined number. If the number of non-verified strings is not less than the pre-determined number, then a status of fail is reported for the operation at step 934. If the number of non-verified strings is less than the predetermined number, a status of pass is reported at step 936 and the un-programmed region of the block is programmed at step 938.

Figure 24:
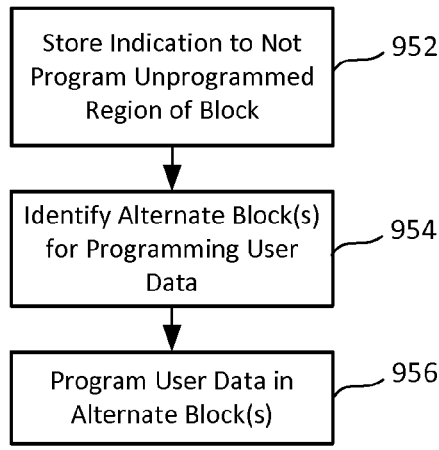
FIG. 24 is a flowchart describing a process of limiting programming in an un-programmed region of a memory block in accordance with one embodiment.

FIG. 24 is a flowchart describing a process of limiting programming in the un-programmed region of a memory block according to one embodiment. For example, the process of FIG. 24 may be performed as part of step 914 in FIG. 21. At step 952, the managing circuitry responds to a failure to successfully verify the un-programmed region for an erased state and/or a determination that an open block read count is above a threshold, by limiting programming in the un-programmed region. In this example, the managing circuitry stores an indication at step 952 that the un-programmed region should not be programmed. The indication at step 952 may prevent programming of any pages of data in the un-programmed region. The indication can indicate the un-programmed region should not be programmed until the block is subsequently erased. The managing circuitry may store the indication in the non-volatile memory array or in another location such as a local memory to the controller or control circuitry. Storing the indication at step 952 is optional.

At step 954, the managing circuitry identifies one or more alternate blocks in the memory array to store the user data for the programming request. The managing circuitry may utilize another open block to complete the programming request, or use a new block by erasing an entire memory block and programming with the user data. At step 956, the managing circuitry programs the remaining user data into the one or more alternate blocks. In one example, the managing circuitry does not store an indication at step 952, but proceeds directly to step 954 to provide alternate programming for the user data.

Figure 25:
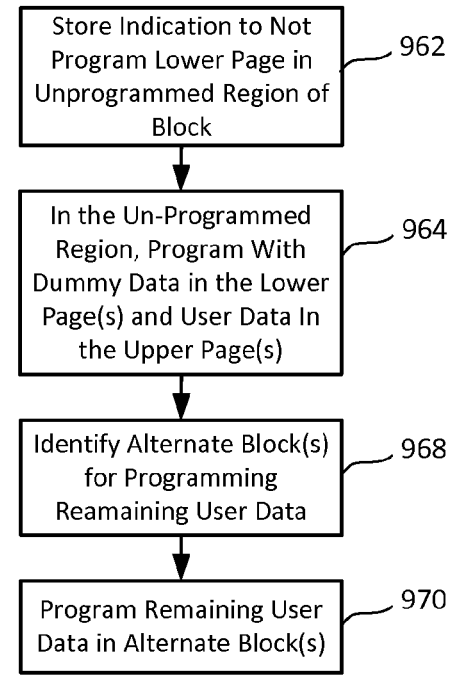
FIG. 25 is a flowchart describing a process of limiting programming by programming a subset of pages in an un-programmed region of an open memory block.

FIG. 25 is a flowchart describing another process of limiting programming in the un-programmed region of a memory block according to one embodiment as can be performed as part of step 914 in FIG. 21. At step 962, the managing circuitry responds to a failure to successfully verify and/or a determination that an open block read count is above a threshold, by partially limiting programming in the un-programmed region. In this example, the managing circuitry stores an indication at step 962 that a subset of the pages in the un-programmed region should not be programmed. The indication at step 962 may prevent programming of a first subset of pages of data in the un-programmed region, while allowing programming of a second subset of pages of data. The indication can indicate the first subset of pages in the un-programmed region should not be programmed until the entire block is subsequently erased. The managing circuitry may store the indication in the non-volatile memory array or in another location such as a local memory to the controller or control circuitry. Storing the indication at step 962 is optional.

As noted in FIG. 16, for example, the effects of open block reading or most pronounced on the lower page or lower pages. Accordingly, the managing circuitry can inhibit programming of one or more lower pages of data for a word line in the un-programmed region after open block reading, but allow programming of one or more upper pages of data. For example, the managing circuitry may allow programming of the upper page of data, but prohibit programming of the lower and middle pages of data in a 3-bit per cell architecture. The managing circuitry may allow programming of the middle and upper pages, while prohibiting programming of the lower page. In a 4-bit per cell architecture, the managing circuitry may allow programming of the two uppermost pages, while prohibiting programming of the two lowest pages. Other variations and options are possible.

At step 964, the managing circuitry programs in the un-programmed region of the block. The managing circuitry programs with dummy data in the one or more lower pages and with user data in the one or more upper pages. The dummy data can be any data. Random data is used in one example or a fixed data pattern can be used. Various options can be used to program the dummy data. In one example, dummy data is no data and the lower pages are not programmed with any user data.

If the amount of user data for the programming request exceeds the size of the one or more upper pages, the managing circuitry identifies one or more alternate blocks for programming the remaining user data at step 968. At step 970, the managing circuitry programs the remaining data in the one or more alternate blocks of the memory array. In one example, the managing circuitry can skip storing the indication at step 962 and proceed directly with programming.

In one example, the managing circuitry can combine partial block erasing as shown in FIG. 23, with a limitation on programming the un-programmed region of a block as shown in FIG. 25. For example, the managing circuitry may respond to a failure to verify the un-programmed region and/or a determination that the read count has exceeded a threshold by performing a partial block erase in the un-programmed region of the block. The partial block erase can be a weak erase in one embodiment. For example, the managing circuitry may apply a lower peak erase voltage pulse Verase or otherwise limit erasing in the un-programmed region. The managing circuitry may skip verification operations during the partial block erase or perform them as earlier described. If verification is used, a higher verification level can be used to end the erase earlier with the cells not erased as deeply. After performing a partial block erase, the managing circuitry may program one or more upper pages in the un-programmed region of the block while prohibiting programming of one or more lower pages of data. The managing circuitry may store an indication as earlier described or may simply proceed from the partial block erase to programming and determining any alternate blocks that may be necessary.

Accordingly, a non-volatile storage device is described that includes a block of non-volatile storage elements including a set of word lines, and managing circuitry in communication with the block of non-volatile storage elements. The managing circuitry is configured to receive a programming request associated with a second subset of the word lines of the block after reading from one or more word lines of a first subset of the word lines of the block. The managing circuitry is configured to verify the second subset of word lines for an erased state prior to programming the second subset and to erase the second subset of word lines while inhibiting the first subset of word lines from being erased in response to verifying that the second subset of word lines are not in the erased state.

A method is described that includes receiving a programming request associated with a second subset of word lines of a block of non-volatile storage elements. The second subset of word lines has not been programmed since a last erase operation and the block of non-volatile storage elements includes a first subset of word lines that has been programmed since the last erase operation. The method includes verifying the second subset of word lines for an erased state prior to programming the second subset of word line, and in response to verifying that the second subset of word lines is not in the erased state, storing an indication that one or more pages of the second subset of word lines should not be programmed until the block is erased.

A method is described that includes performing one or more read operations for a first subset of word lines of a block of non-volatile storage elements. The first subset of word lines includes non-volatile storage elements that have been programmed since a previous erase operation for the block of non-volatile storage elements and the block of non-volatile storage elements includes a second subset of word lines with non-volatile storage elements that have not been programmed since the previous erase operation. The method includes receiving a programming request associated with the second subset of word lines of the block after performing the one or more read operations for the first subset of word lines and verifying the second subset of word lines for an erased state prior to programming the second subset of word lines. The method includes erasing the second subset of word lines while inhibiting the first subset of word lines from being erased in response to verifying that the second subset of word lines are not in the erased state.

A non-volatile storage device is described that includes a block of non-volatile storage elements including a set of word lines, and managing circuitry in communication with the block of non-volatile storage elements. The managing circuitry is configured to perform one or more read operations for a first subset of word lines of the block including non-volatile storage elements that have been programmed since a previous erase operation for the block of non-volatile storage elements. The managing circuitry is configured to receive a programming request associated with a second subset of the word lines of the block after reading from one or more word lines of the first subset of the word lines of the block, and to determine if a number of the one or more read operations is above a threshold number of read operations. The managing circuitry is configured to erase the second subset of word lines while inhibiting the first subset of word lines from being erased if the number of the one or more read operations is above the threshold number, and to program the second subset of word lines without erasing the second subset of word lines if the number of the one or more read operations is below the threshold number.

A non-volatile storage device is described that includes a block of non-volatile storage elements including a set of word lines, and managing circuitry in communication with the block of non-volatile storage elements. The managing circuitry is configured to perform one or more read operations for a first subset of word lines of the block including non-volatile storage elements that have been programmed since a previous erase operation for the block of non-volatile storage elements. The managing circuitry is configured to receive a programming request associated with a second subset of the word lines of the block after reading from one or more word lines of the first subset of the word lines of the block, and to determine if a number of the one or more read operations is above a threshold number of read operations. The managing circuitry is configured to program one or more upper pages of the second subset of word lines with user data for the programming request and one or more lower pages of the second subset of word lines with dummy data if the number of the one or more read operations is above the threshold number.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A non-volatile storage device, comprising:
a block of non-volatile storage elements including a set of word lines; and
managing circuitry in communication with the block of non-volatile storage elements, the managing circuitry is configured to receive a programming request associated with a second subset of the word lines of the block after reading from one or more word lines of a first subset of the word lines of the block, the second subset of word lines has not been programmed since a last erase operation, the managing circuitry is configured to verify the second subset of word lines for an erased state prior to programming the second subset, the managing circuitry is configured to erase the second subset of word lines while inhibiting the first subset of word lines from being erased in response to verifying that the second subset of word lines are not in the erased state.

2. The non-volatile storage device of claim 1, wherein:
the programming request is a second programming request;
the managing circuitry is configured to erase the block of non-volatile storage elements in response to a first programming request associated with the first subset of word lines;
the managing circuitry is configured to program the first subset of word lines after erasing the block of non-volatile storage elements;
the managing circuitry is configured to respond to a read request by reading from the one or more word lines of the first subset of word lines after programming the first subset.

3. The non-volatile storage device of claim 1, wherein:
the managing circuitry is configured to determine in response to the programming request, a number of read operations associated with the first subset of word lines since programming the first subset of word lines; and
the managing circuitry is configured to verify the second subset of word lines for the erased state in response to determining that the number of read operations is above a threshold number of read operations.

4. The non-volatile storage device of claim 1, wherein:
the managing circuitry is configured to verify the second subset of word lines for the erased state in response to the programming request.

5. The non-volatile storage device of claim 1, wherein:
the managing circuitry is configured to erase the second subset of word lines using a weak erase configured to only partially erase non-volatile storage elements of the second subset of word lines.

6. The non-volatile storage device of claim 5, wherein:
the managing circuitry is configured to store in response to verifying that the second subset of word lines are not in the erased state, an indication that one or more pages of the second subset of word lines should not be programmed until the block is erased.

7. The non-volatile storage device of claim 6, wherein:
the indication indicates that one or more lower pages of the second subset of word lines should not be programmed;

the managing circuitry is configured to program one or more upper pages of the second subset of word lines with user data in response to the indication; and
the managing circuitry is configured to program the one or more lower pages of the second subset of word line with dummy data in response to the indication.

8. The non-volatile storage device of claim 1, wherein:
the block of non-volatile storage elements includes a plurality of NAND strings of non-volatile storage elements that are coupled to each of the word lines of the block; and
the managing circuitry is configured to erase the second subset of word lines while inhibiting the first subset of word lines from being erased by erasing a second set of non-volatile storage elements from each of the NAND strings of the block while inhibiting a first set of non-volatile storage elements from each of the NAND strings of the block from being erased.

9. The non-volatile storage device of claim 8, wherein the managing circuitry is configured to erase the second subset of word lines while inhibiting the first subset of word lines from being erased by:
providing a first positive voltage to the first subset of word lines;
providing a second positive voltage lower than the first positive voltage or zero volts to the second subset of word lines; and
providing a third positive voltage to the plurality of NAND strings, the third positive voltage is higher than the first positive voltage.

10. The non-volatile storage device of claim 9, wherein:
the plurality of NAND strings are formed in a two dimensional memory array using a substrate; and
the managing circuitry is configured to provide the third positive voltage to the plurality of NAND strings by applying one or more positive erase voltage pulses to a well formed in the substrate for the plurality of NAND strings.

11. The non-volatile storage device of claim 9, wherein:
the plurality of NAND strings are vertical NAND strings in a three dimensional memory array formed above a substrate;
the plurality of NAND string are coupled to a plurality of bit lines; and
the managing circuitry is configured to provide the third positive voltage to a channel for each of the NAND strings of the plurality of NAND strings by applying one or more positive erase voltage pulses to the plurality of bit lines.

12. A method, comprising:
receiving a programming request associated with a second subset of word lines of a block of non-volatile storage elements, the second subset of word lines has not been programmed since a last erase operation and the block of non-volatile storage elements includes a first subset of word lines that has been programmed since the last erase operation;
prior to programming the second subset of word lines, verifying the second subset of word lines for an erased state; and
in response to verifying that the second subset of word lines is not in the erased state, storing an indication that one or more pages of the second subset of word lines should not be programmed until the block is erased.

13. The method of claim 12, wherein the indication indicates that a lower page of the second subset of word lines should not be programmed, the method further comprising:

programming an upper page of the second subset of word lines with user data; and programming the lower page of the second subset of word line with dummy data.

14. The method of claim 12, wherein the indication indicates that all pages of the second subset of word lines should not be programmed, the method further comprising:

determining one or more alternate blocks for fulfilling the programming request associated with the second subset of the word lines of the block.

15. A method, comprising:

performing one or more read operations for a first subset of word lines of a block of non-volatile storage elements, the first subset of word lines including non-volatile storage elements that have been programmed since a previous erase operation for the block of non-volatile storage elements, the block of non-volatile storage elements including a second subset of word lines including non-volatile storage elements that have not been programmed since the previous erase operation;

after performing the one or more read operations for the first subset of word lines, receiving a programming request associated with the second subset of word lines of the block;

prior to programming the second subset of word lines, verifying the second subset of word lines for an erased state; and in response to verifying that the second subset of word lines are not in the erased state, erasing the second subset of word lines while inhibiting the first subset of word lines from being erased.

16. The method of claim 15, further comprising:

in response to the programming request, determining a number of read operations associated with the first subset of word lines since programming the first subset of word lines;

wherein said verifying the second subset of word lines for the erased state is performed in response to determining that the number of read operations is above a threshold number of read operations.

17. The method of claim 15, wherein:

erasing the second subset of word lines includes a weak erase configured to only partially erase non-volatile storage elements of the second subset of word lines;

the method further comprises, in response to verifying that the second subset of word lines are not in the erased state, storing an indication that one or more pages of the second subset of word lines should not be programmed until the block is erased.

18. The method of claim 17, wherein the indication indicates that one or more lower pages of the second subset of word lines should not be programmed, the method further comprising:

programming one or more upper pages of the second subset of word lines with user data; and programming the one or more lower pages of the second subset of word line with dummy data.

19. The method of claim 15, further comprising:

programming the second subset of word lines in response to the programming request after verifying that the second subset of word lines have been erased.

20. The method of claim 15, further comprising:

if the second subset of word lines is verified for the erased state in response to said verifying, programming the second subset of word lines without erasing the second subset.

21. A non-volatile storage device, comprising:

a block of non-volatile storage elements including a set of word lines; and managing circuitry in communication with the block of non-volatile storage elements, the managing circuitry is configured to perform one or more read operations for a first subset of word lines of the block including non-volatile storage elements that have been programmed since a previous erase operation for the block of non-volatile storage elements, the managing circuitry is configured to receive a programming request associated with a second subset of the word lines of the block after reading from one or more word lines of the first subset of the word lines of the block, the managing circuitry is configured to determine if a number of the one or more read operations is above a threshold number of read operations, the managing circuitry is configured to erase the second subset of word lines while inhibiting the first subset of word lines from being erased if the number of the one or more read operations is above the threshold number, the managing circuitry is configured to program the second subset of word lines without erasing the second subset of word lines if the number of the one or more read operations is below the threshold number.

22. The non-volatile storage device of claim 21, wherein:

the managing circuitry is configured to erase the second subset of word lines using a weak erase to only partially erase non-volatile storage elements of the second subset of word lines; and the managing circuitry is configured to store an indication that one or more pages of the second subset of word lines should not be programmed until the block is fully erased.

23. The non-volatile storage device of claim 22, wherein:

the managing circuitry is configured to program an upper page of the second subset of word lines with user data in response to the indication; and the managing circuitry is configured to program a lower page of the second subset of word lines with dummy data in response to the indication.

24. The non-volatile storage device of claim 21, wherein:

the managing circuitry is configured to verify the second subset of word lines for an erased state in response to the number of the one or more read operations being above the threshold; and the managing circuitry is configured to erase the second subset of word lines in response to the second subset of word lines not being in the erased state.

25. A non-volatile storage device, comprising:

a block of non-volatile storage elements including a set of word lines; and managing circuitry in communication with the block of non-volatile storage elements, the managing circuitry is configured to perform one or more read operations for a first subset of word lines of the block including non-volatile storage elements that have been programmed since a previous erase operation for the block of non-volatile storage elements, the managing circuitry is configured to receive a programming request associated with a second subset of the word lines of the block after reading from one or more word lines of the first subset of the word lines of the block, the managing circuitry is configured to determine if a number of the one or more read operations is above a threshold number of read operations, the managing circuitry is configured to program one or more upper pages of the second subset of word lines with user data for the programming request and one or more lower pages of the second subset of word lines with dummy data if the number of the one or more read operations is above the threshold number.

26. The non-volatile storage device of claim 25, wherein:
the managing circuitry is configured to program the one or more lower pages of the second subset of word lines with the user data for the programming request if the number of the one or more read operations is below the threshold number.

27. The non-volatile storage device of claim 25, wherein:
the managing circuitry is configured to verify the second subset of word lines for an erased state in response to determining that the number of the one or more read operations is above the threshold number; and
the managing circuitry is configured to program the one or more lower pages of the second subset of word lines with dummy data if the number of the one or more read operations is above the threshold number and the second subset of word lines is not verified for the erased state.

* * * * *